US010877840B2

(12) United States Patent
Kumar et al.

(10) Patent No.: US 10,877,840 B2
(45) Date of Patent: Dec. 29, 2020

(54) DYNAMIC NEIGHBOR AND BITLINE ASSISTED CORRECTION FOR NAND FLASH STORAGE

(71) Applicant: SK hynix Inc., Gyeonggi-do (KR)

(72) Inventors: Naveen Kumar, San Jose, CA (US); Aman Bhatia, San Jose, CA (US); Yu Cai, San Jose, CA (US); Fan Zhang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/421,204

(22) Filed: May 23, 2019

(65) Prior Publication Data

US 2020/0042384 A1    Feb. 6, 2020

Related U.S. Application Data

(60) Provisional application No. 62/713,958, filed on Aug. 2, 2018.

(51) Int. Cl.
*G06F 11/10* (2006.01)
*H03M 13/45* (2006.01)
(Continued)

(52) U.S. Cl.
CPC .......... *G06F 11/1068* (2013.01); *G11C 29/52* (2013.01); *H03M 13/458* (2013.01); *G06F 17/12* (2013.01)

(58) Field of Classification Search
CPC .. G06F 11/1068; G06F 17/12; G06F 11/1012; H03M 13/458; H03M 13/2963;
(Continued)

(56) References Cited

U.S. PATENT DOCUMENTS 9,252,817 B2\*  2/2016  Pan ................... H03M 13/3927
10,218,388 B2\*  2/2019  Lin ................... H03M 13/2963
(Continued)

OTHER PUBLICATIONS

G. Dong, N. Xie and T. Zhang, "On the Use of Soft-Decision Error-Correction Codes in nand Flash Memory," in IEEE Transactions on Circuits and Systems I: Regular Papers, vol. 58, No. 2, pp. 429-439, Feb. 2011. (Year: 2011).\*
(Continued)

*Primary Examiner* — Cynthia Britt
(74) *Attorney, Agent, or Firm* — Kilpatrick Townsend & Stockton LLP

(57) ABSTRACT

A storage system includes memory cells arranged in an array and a memory controller coupled to the memory cells for controlling operations of the memory cells. The memory controller is configured to perform a read operation in response to a read command from a host, perform a first soft decoding of data from the read operation using existing LLR (log likelihood ratio) values stored in the memory controller, update existing LLR values using LLR values from neighboring memory cells and existing weight coefficients that account for influence from the neighboring memory cells. The memory controller is also configured to perform a second soft decoding using the updated LLR values. If the second soft decoding is successful, the memory controller performs a recursive update of weight coefficients to reflect updated influence from neighboring memory cells and stores the updated weight coefficient in the memory controller for use in further decoding.

20 Claims, 11 Drawing Sheets

(51) Int. Cl.
*G11C 29/52* (2006.01)
*G06F 17/12* (2006.01)

(58) Field of Classification Search
CPC ......... H03M 13/3707; H03M 13/3723; H03M 13/1111; H03M 13/1108; H03M 13/152; G11C 29/52; G11C 29/42; G11C 16/0483; G11C 16/08
See application file for complete search history.

(56) References Cited

U.S. PATENT DOCUMENTS

| | | | |
|---|---|---|---|
| 10,389,383 B2* | 8/2019 | Xiong | H03M 13/1137 |
| 2015/0242268 A1* | 8/2015 | Wu | G11C 29/52 |
| | | | 714/773 |
| 2015/0364202 A1* | 12/2015 | Karakulak | G11C 11/5642 |
| | | | 365/185.2 |
| 2016/0011970 A1 | 1/2016 | Sakurada | |
| 2017/0179980 A1* | 6/2017 | Lin | H03M 13/2948 |
| 2019/0340062 A1 | 11/2019 | Cai et al. | |

OTHER PUBLICATIONS

K. Le and F. Ghaffari, "On the Use of Hard-Decision LDPC Decoders on MLC NAND Flash Memory," 2018 15th International Multi-Conference on Systems, Signals & Devices (SSD), Hammamet, 2018, pp. 1453-1458. (Year: 2018).*

* cited by examiner

DYNAMIC NEIGHBOR AND BITLINE ASSISTED CORRECTION FOR NAND FLASH STORAGE

CROSS-REFERENCES TO RELATED APPLICATIONS

The present application claims priority to Provisional Application No. 62/713,958 entitled "ON THE FLY NEIGHBOR AND BITLINE ASSISTED CORRECTION FOR NAND FLASH STORAGE," filed Aug. 2, 2018, which is assigned to the assignee hereof and expressly incorporated by reference herein in its entirety.

This application is also related to U.S. patent application Ser. No. 15/173,446, entitled "TECHNIQUES FOR LOW COMPLEXITY SOFT DECODER FOR TURBO PRODUCT CODES," filed Jan. 3, 2016, now U.S. Pat. No. 10,218,388, which is assigned to the assignee hereof and expressly incorporated by reference herein in its entirety. This application is also related to U.S. patent application Ser. No. 15/654,492, entitled "LOW-COMPLEXITY LDPC ENCODER," filed Jul. 19, 2017, which is assigned to the assignee hereof and expressly incorporated by reference herein in its entirety.

BACKGROUND OF THE INVENTION

The present invention relates generally to systems and methods for storage devices, and specifically to improving performance of non-volatile memory devices.

Solid-state memory is ubiquitously used in a variety of electronic systems including, for example, consumer electronic devices (e.g., cellular phones, cameras, computers, etc.) and in enterprise computing systems (e.g., hard drives, random access memory (RAM), etc.). Solid-state memory has gained popularity over mechanical or other memory storage techniques due to latency, throughput, shock resistance, packaging, and other considerations. Among these non-volatile memory devices, NAND flash memory devices are popular due to low manufacturing cost for a high degree of integration.

In a NAND memory, coupling capacitance exists between the target cell and the neighboring cells. Depending upon the data to be programmed into the cells, the electric field can affect neighboring cells as a voltage threshold increase and can result in a different read cell voltage. Further, in some 3-D memories, leakage of charges can occur between adjacent cells at different layers. In that case, the influence of neighboring cells can cause a negative shift in the threshold voltage of the target cell.

BRIEF SUMMARY OF THE INVENTION

Some conventional schemes for removing the effect of neighboring wordlines on the wordline, which is not decoded successfully by a decoder, e.g., an LDPC decoder, have drawbacks such as requiring a look up table (LUT) to be stored in the hardware, which can lead to larger SoC area.

In some embodiments of the present invention, methods are provided for removing the effect of neighboring wordlines as well as bitline interference. Some embodiments also include an on the fly training and removal of wordline and bitlines interference. These methods have the capability to adapt according to interference present in the NAND data.

In some embodiments, a linear model is provided for modeling bitline and wordline interference. The coupling coefficients are assumed to be a function of program erase cycles (PE), read disturb (RD) and retention time (Ret). The coupling coefficients can change across the lifespan of the drive and can be adapted according to successfully decoded data. Estimating coupling coefficients can be based on a minimum mean square error (MMSE) estimator and furthermore the optimal coupling coefficients can be found based on Ret, PEC, and RD.

According to some embodiments of the invention, a non-volatile data storage device includes memory cells arranged in a two-dimensional array having rows and columns, each row associated with a word line and each column associated with a bit line, and a memory controller coupled to the memory cells for controlling operations of the memory cells. The memory controller is configured to perform a read operation in response to a read command from a host. The memory controller performs hard decoding of data from the read operation, and determines whether the hard decoding is successful wherein no errors are uncorrected. If the hard decoding is successful, the memory controller determines that the read operation is successful and presents the data to the host. On the other hand, if the hard decoding is unsuccessful, the memory controller performs a first soft decoding using existing LLR (log likelihood ratio) values stored in the memory controller, and determines if the first soft decoding is successful wherein no errors are uncorrected. If the first soft decoding is successful, the memory controller determines that the read operation is successful and presents the data to the host. If the first soft decoding is unsuccessful, the memory controller updates LLR values using LLR values from neighboring memory cells and existing weight coefficients that account for influence from the neighboring memory cells. The memory controller performs a second soft decoding using the updated LLR values, and determines whether the second soft decoding is successful wherein no errors are uncorrected. If the second soft decoding is unsuccessful, the memory controller determines that the read operation has failed. If the second soft decoding is successful, the memory controller determines that the decoding is successful, and presents decoded data to the host. Further, the memory controller performs a recursive update of weight coefficients to reflect updated influence from neighboring memory cells. The memory controller also stores the updated weight coefficient in the memory controller for use in further decoding.

In some embodiments of the above non-volatile data storage device, an estimated LLR value for a memory cell at wordline N and bit line K, $ELLR_k^N$, is expressed as a weighted sum of LLR values of memory cells in a vicinity of the memory cell in the following linear equation:

$$ELLR_k^N = [LLR_{k-1}^{N-1}, LLR_k^{N-1}, LLR_{k+1}^{N-1}, LLR_{k-1}^N,$$
$$LLR_k^N, LLR_{k+1}^N, LLR_{k-1}^{N+1}, LLR_k^{N+1},$$
$$LLR_{k+1}^{N+1}].$$

$$[W_{k-1}^{N-1}, W_k^{N-1}, W_{k+1}^{N-1}, W_{k-1}^N, W_k^N, W_{k+1}^N,$$
$$W_{k-1}^{N+1}, W_k^{N+1}, W_{k+1}^{N+1}]^T,$$

wherein:
$LLR_j^i$ is the LLR value for a neighboring memory cell at (i)th bitline and (j)th wordline; and
$W_j^i$ is a weight coefficient relating estimated LLR for a memory cell at wordline N and bit line K, $ELLR_k^N$, to an LLR,
wherein N, K, i, and j are integers, and the superscript T denotes a transpose of a vector or matrix.

In some embodiments, initial existing weight coefficients are determined by finding a solution, offline using training data, to the following equation, $$\overline{B} = \overline{AX}$$

wherein:
$\overline{B}$ is a vector of dimension L for estimated LLR values, ELLR, for L memory cells, where L is an integer;
$\overline{A}$ is a matrix of LLR values of memory cells in the vicinity of each of the L memory cells; and
$\overline{X}$ is a vector of weight coefficients relating $\overline{A}$ and $\overline{B}$, and is expressed as a function of $\overline{B}=\overline{AX}$, wherein the solution is expressed as $$\tilde{X} = (\overline{A}^T\overline{A})^{-1}\overline{A}^T\overline{B}.$$

In some embodiments, the vector $\overline{X}$ and the solution $\tilde{X}$ are functions of one or more of program/erase cycles (PEC), retention time (RET), and read disturb (RD), and the solution to the equation $\overline{B}=\overline{AX}$(PEC, RET, RD) is expressed as:

$$\tilde{X}(PEC, RET, RD) = (\overline{A}^T\overline{A})^{-1}\overline{A}^T\overline{B}.$$

In some embodiments, the recursive update of the weight coefficients comprises recursively finding an optimal $\tilde{X}$ in a minimum mean square error (MMSE) estimator to minimize the difference between $\overline{AX}$ and $\overline{B}$, formulated as the following equation:

$$\tilde{X}(PEC, RET, RD) = \mathrm{argmin}_{\nabla \tilde{X}} |\overline{A}\tilde{X}(PEC, RET, RD) - \overline{B}|^2$$

wherein the update equation is given as, $$\tilde{X}_{i+1} = \tilde{X}_i - \mu \cdot \overline{A}^T \cdot (\overline{A}\tilde{X}(PEC, RET, RD) - \overline{B}$$

where $\tilde{X}_{i+1}$ are the updated weight coefficients at the (i+1)th instant with i being an integer, and $\mu$ is an adaptation coefficient whose value can be selected heuristically to optimize convergence of the MMSE update equation.

In some embodiments, the memory controller is further configured to estimate weight coefficients using a function of program erase cycles (PEC), read disturb (RD), and retention (RET), and apply neighbor assisted and bitline interference corrections on the data with the weight coefficients.

In some embodiments, the memory controller is further configured to perform soft decoding using the recursively updated weight coefficients on the fly after a successful soft decoding.

According to some embodiments of the invention, a non-volatile data storage device includes memory cells arranged in an array having rows and columns, each row associated with a word line and each column associated with a bit line, and a memory controller coupled to the memory cells for controlling operations of the memory cells. The memory controller is configured to perform a read operation in response to a read command from a host, and to perform a first soft decoding of data from the read operation using existing LLR (log likelihood ratio) values stored in the memory controller. If the first soft decoding is unsuccessful, the memory controller updates existing LLR values using LLR values from neighboring memory cells and existing weight coefficients that account for influence from the neighboring memory cells. The memory controller performs a second soft decoding using the updated LLR values. If the second soft decoding is successful, the memory controller determines that the decoding is successful, and presents decoded data to the host. The memory controller further performs a recursive update of weight coefficients to update influence from neighboring memory cells, and stores the updated weight coefficient in the memory controller for use in further decoding.

According to some embodiments of the invention, a method of controlling a storage system is provided. The storage system includes memory cells arranged in an array having rows and columns, each row associated with a word line and each column associated with a bit line and a memory controller coupled to the memory cells for controlling operations of the memory cells. The method includes performing a read operation in response to a read command from a host, and performing a first soft decoding of data from the read operation using existing LLR (log likelihood ratio) values stored in the memory controller. The method also includes updating LLR values using LLR values from neighboring memory cells and existing weight coefficients that account for influence from the neighboring memory cells, and performing a second soft decoding using the updated LLR values. If the second soft decoding is successful, it is determined that the decoding is successful, and the method includes presenting the data to the host, performing a recursive update of weight coefficients to update influence from neighboring memory cells, and storing the updated weight coefficient in the memory controller for use in further decoding.

Various additional embodiments, features, and advantages of the present invention are provided with reference to the detailed description and accompanying drawings that follow.

DETAILED DESCRIPTION OF THE INVENTION

Error-correcting codes are frequently used in communications, as well as for reliable storage in media such as CDs, DVDs, hard disks, and random access memories (RAMs), flash memories and the like. Error correcting codes may include turbo product codes (TPC), Low density parity check (LDPC) codes, Bose-Chaudhuri-Hocquenghem (BCH) codes, Reed Solomon codes, and the like.

Turbo product codes (TPC) may have two or more dimensions. Each dimension may correspond to a class of error correcting codes, which is referred to herein as constituent codes. As an example, a two-dimensional TPC codeword may include multiple error correcting codewords (hereinafter referred to as row codewords) corresponding to its first dimension, and multiple error correcting codewords (hereinafter referred to as column codewords) corresponding to its second dimension. Each of the row and/or column codewords may include BCH codes, Reed Solomon codes, or the like.

In general, TPC decoding is an iterative decoding among different dimension error correcting codewords. As an example, if BCH codes are used as constituent codes for each dimension of TPC codes, the TPC decoder performs BCH decoding on multiple row codewords and multiple column codewords of the TPC code. In one embodiment, a low complexity soft decoder architecture for TPC codes is disclosed. In one embodiment, soft decoding architecture presented herein may be used for decoding information obtained from NAND memories by generating soft information using several NAND read operations.

Figure 1A:
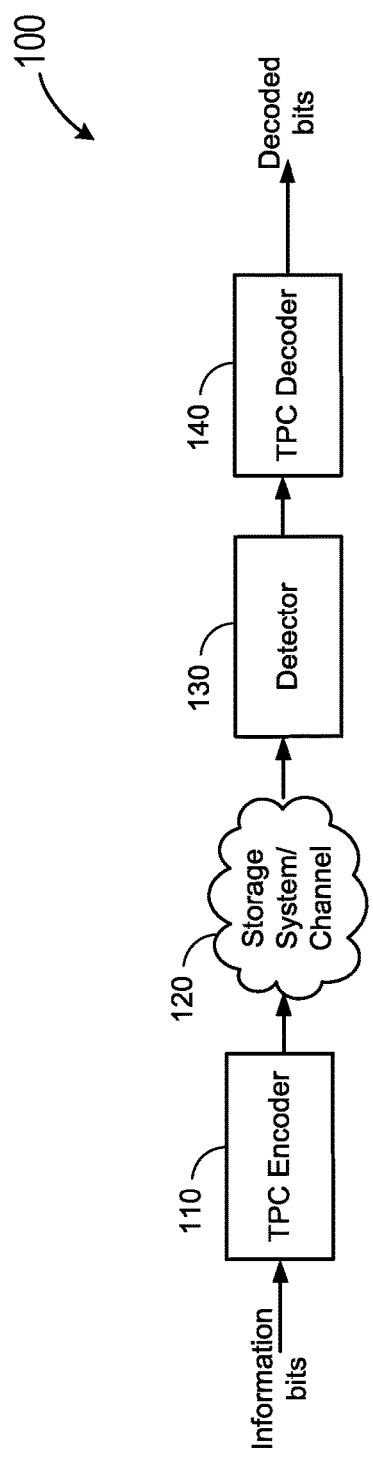
FIG. 1A is a high level block diagram illustrating an example TPC error correcting system, in accordance with certain embodiments of the present disclosure.

FIG. 1A is a high level block diagram illustrating an example TPC error correcting system, in accordance with certain embodiments of the present disclosure. In the example shown, TPC encoder 110 receives information bits that include data which is desired to be stored in a storage system 120 or transmitted in a communications channel. TPC encoded data is output by TPC encoder 110 and is written to storage 120. In various embodiments, storage 120 may include a variety of storage types or media such as (e.g., magnetic) disk drive storage, Flash storage, etc. In some embodiments, the techniques described herein are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), detector 130 receives the data from the storage system. The received data may include some noise or errors. Detector 130 performs detection on the received data and outputs decision and/or reliability information corresponding to one or more bits in a codeword. For example, a soft-output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to TPC decoder 140 which performs TPC decoding using the decision and/or reliability information. A soft input decoder utilizes both the decision and the reliability information to decode the codeword. A hard decoder utilizes only the decision values in the decoder to decode the codeword. After decoding, the decoded bits generated by TPC decoder 140 are passed to the appropriate entity (e.g., the user or application which requested it). With proper encoding and decoding, the information bits match the decoded bits.

Figure 1B:
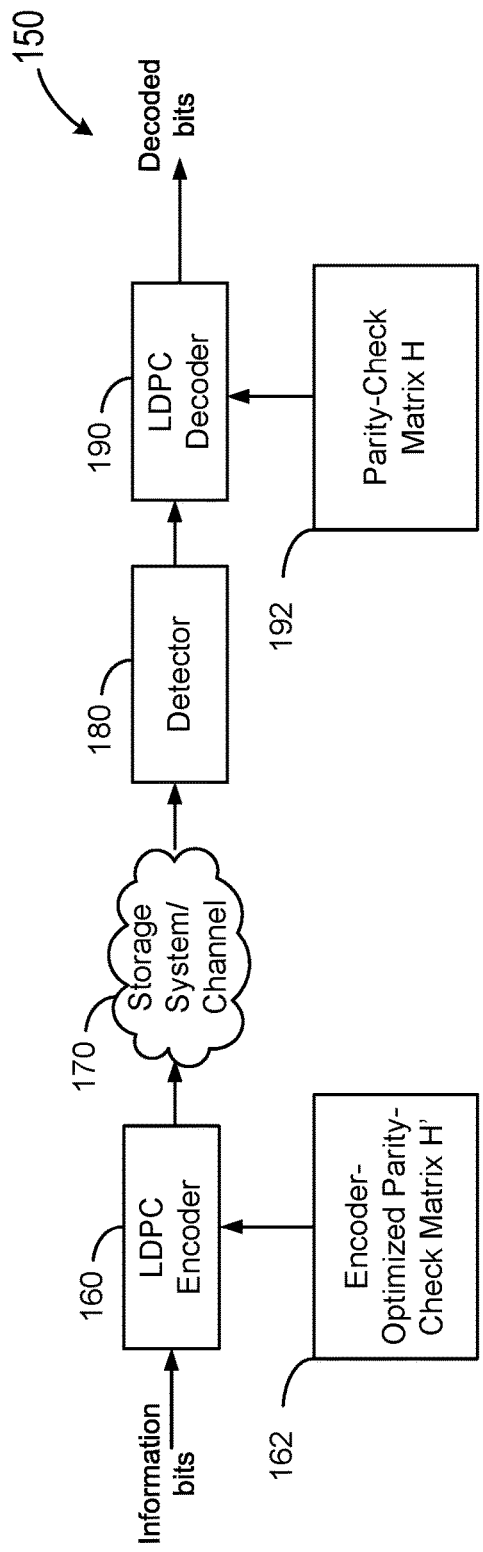
FIG. 1B is a high level block diagram illustrating an example LDPC error correcting system, in accordance with certain embodiments of the present disclosure.

FIG. 1B is a high level block diagram illustrating an example LDPC error correcting system in accordance with certain embodiments of the present disclosure. As illustrated in FIG. 1B, an LDPC encoder 160 of error correction system 150 may receive information bits that include data which is desired to be stored in a storage system 170. LDPC encoded data may be generated by LDPC encoder 160 and may be written to storage system 170. The encoding may use an encoder-optimized parity-check matrix H' 162.

In various embodiments, storage system 170, similar to storage system 120 in FIG. 1A, may include a variety of storage types or media. Errors may occur in data storage or channel. For example, the errors may be caused by, for example, cell-to-cell interference and/or coupling. When the stored data is requested or otherwise desired (e.g., by an application or user which stored the data), a detector 180 may receive data from storage system 170. The received data may include some noise or errors. Detector 180 may include a soft output detector and an hard output detector and may perform detection on the received data and output decision and/or reliability information.

The decision and/or reliability information may be passed to an LDPC decoder 190 which may perform LDPC decoding using the decision and/or reliability information. A soft LDPC decoder may utilize both the decision and the reliability information to decode the codeword. A hard LDPC decoder may utilize only the decision values from the detector to decode the codeword. The decoded bits generated by LDPC decoder 190 may be passed to an appropriate entity (e.g., the user or application which requested it). The decoding may utilize a parity-check matrix H 192, which may be optimized for LDPC decoder 190 by design. With proper encoding and decoding, the decoded bits would match the information bits. In some implementations, parity-check matrix H 192 may be same as encoder-optimized parity-check matrix H' 162. In some implementations, encoder-optimized parity-check matrix H' 162 may be modified from parity-check matrix H 192. In some implementations, parity-check matrix H 192 may be modified from encoder-optimized parity-check matrix H' 162.

Further details of LDPC decoding can be found in U.S. patent application Ser. No. 15/654,492, entitled "LOW-COMPLEXITY LDPC ENCODER," filed Jul. 19, 2017, which is assigned to the assignee hereof and expressly incorporated by reference herein in its entirety.

In the following description, Turbo product codes (TPC) with BCH codes as constituent code is described as an example. However, it is understood that the techniques described herein are applicable to any class of codes, for example, LDPC codes, without departing from the teachings of the present disclosure.

Figure 2:
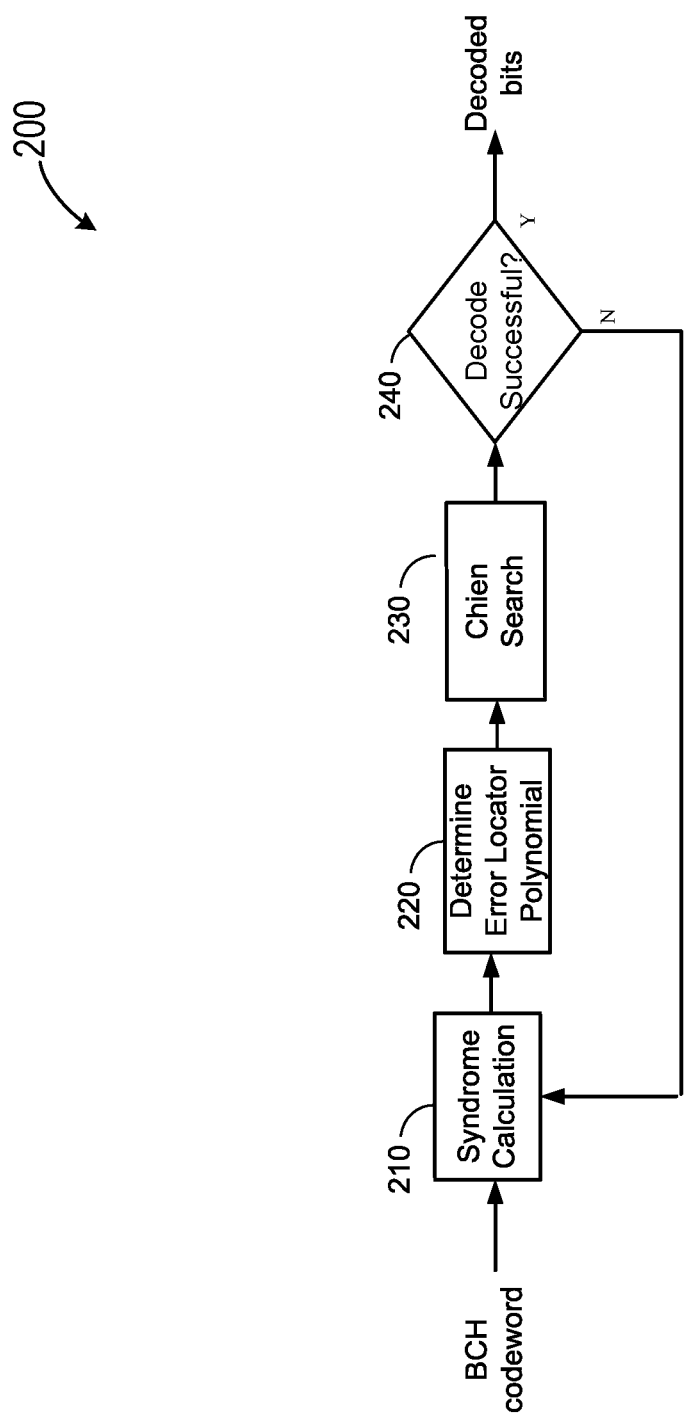
FIG. 2 is a simplified block diagram illustrating an example BCH decoder 200 in accordance with certain embodiments of the present disclosure.

FIG. 2 is a simplified block diagram illustrating an example BCH decoder 200 in accordance with certain embodiments of the present disclosure. As illustrated, the decoder receives a BCH codeword and starts an iterative decoding process. For each iteration, BCH decoder 200 performs syndrome calculation (step 210) on the received codeword, determines error locator polynomial (step 220), and performs Chien search or similar procedures to determine roots of error locator polynomial (step 230). Roots of the error locator polynomial provide an indication of where the errors in the codeword are located.

After correcting the errors, at 240, the decoder checks if the decoding process has resulted in a correct codeword. If yes, the decoder outputs the decoded bits. If not, the decoder may generate a bit flipping pattern, flip one or more bits of the codeword based on the pattern and calculate syndrome values of the new codeword. The decoding process may continue until a correct codeword is found and/or a predetermined maximum number of iterations is reached.

In BCH decoding, syndrome values are usually calculated after receiving each codeword. In one embodiment, syndrome values may be updated based on previous syndrome values and corrected data. Thus, the syndrome calculation procedure may only be performed at the beginning of the decoding process. The syndromes corresponding to each of the codewords may be updated in subsequent iterations based on previous syndrome values.

Given the natural numbers m and t, a t-error correcting binary BCH code of length $n=2^m-1$ may be defined as: $c(x) \in GF(2)[x]$: deg $c(x) \leq n-1$, $c(a)=c(a^2)=c(a^3)= \ldots =c(a^{2t})=0$ where $a \in GF(2^m)$ is a primitive element. In other words, it is the set of all binary polynomials of degree at most n−1 such that when these are treated as polynomials over $GF(2^m)$, they must have a, $a^2$, $a^2$, ..., $a^{2t}$ as their roots.

If c(x) is the transmitted codeword, e(x) is the error polynomial, and R(x)=c(x)+e(x) is the received codeword, then given that a, $a^2$, $a^2$, ..., $a^2$t are roots of c(x), an initial component syndrome may be calculated as:

$$S_i = r(a^{i+1}) = e(a^{i+1})$$

for i=0, 1, ..., 2t−1.

The error locator polynomial generator uses the syndromes $S_0$, $S_1$, $S_{2t-1}$ to generate the error location polynomial $\wedge(x)$, which is defined as:

$$\wedge(x) = \Pi_{i=1}^{v}(1-a^{j_i}x).$$

Several methods exist in the art for finding the locator polynomial. For example, Berlekamp-Massey algorithm, Peterson's algorithm, and the like. The roots of the error locator polynomial (i.e., $j_0$, $j_1$, $j_v$ in the equation above) indicate the locations of the errors, so finding the roots of the error locator polynomial corresponds to finding the locations of the errors in a corresponding codeword.

Roots of the error location polynomial are usually found using Chien search. For binary symbols, once the error locations have been identified, correction simply involves flipping the bit at each identified error location. For non-binary symbols, the error magnitude needs to be calculated, for example, using Forney Algorithm, to find out the magnitude of the correction to be made.

Figure 3:
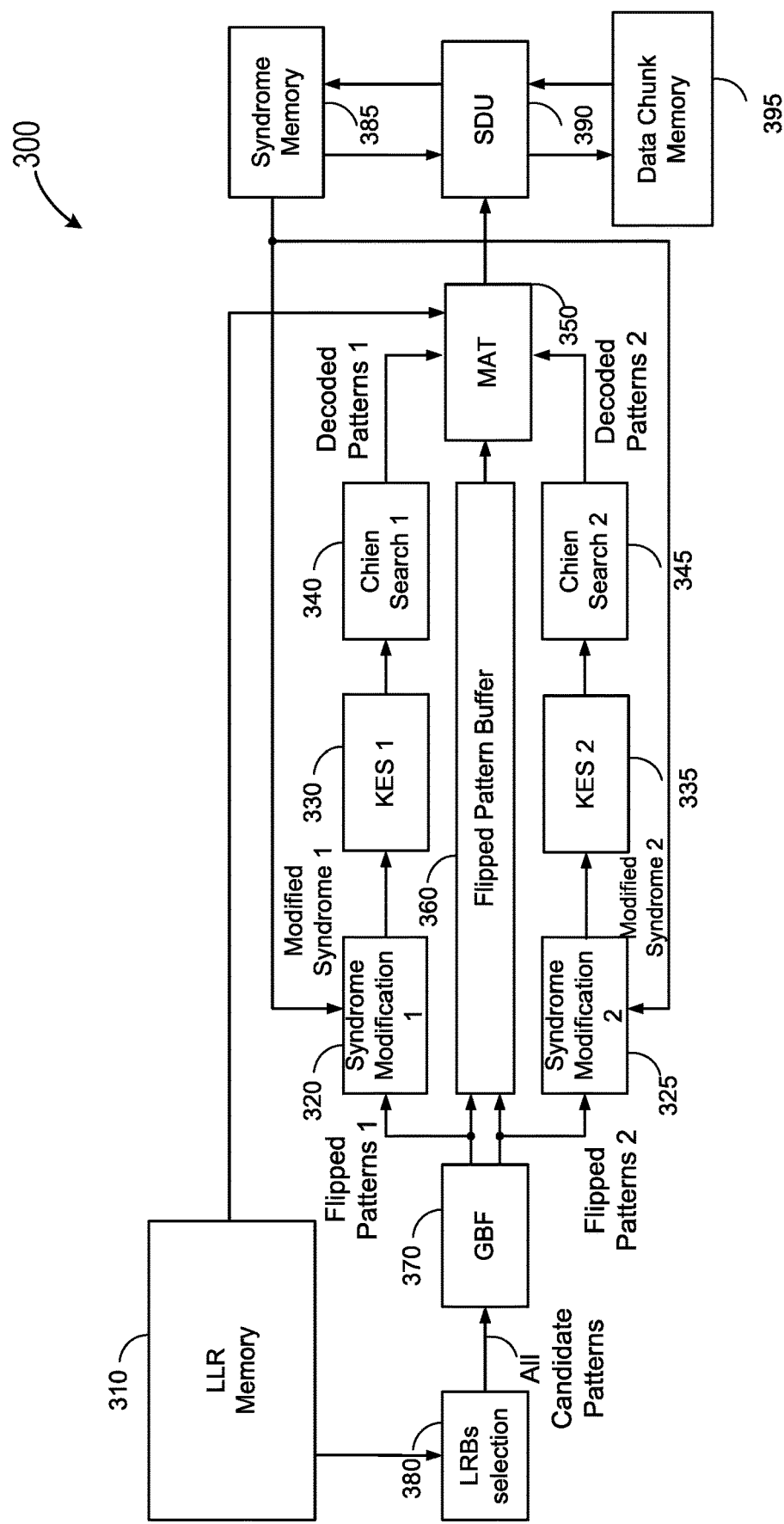
FIG. 3 a simplified block diagram illustrating an example TPC soft decoder in accordance with certain embodiments of the present disclosure.

FIG. 3 a simplified block diagram illustrating an example TPC soft decoder in accordance with certain embodiments of the present disclosure. In this example, syndrome update-based decoders are utilized. However, in general, any other type of soft decoder for any class of codes could be used without departing from the teachings of the present disclosure.

As illustrated, the decoder 300 includes an LLR memory block 310, syndrome modification blocks 320 and 325, key equation solver (KES) blocks 330 and 533, Chien search blocks 340 and 345, miscorrection avoidance block (MAT) 350, syndrome memory 385, syndrome data update (SDU) block 390, general bit flipping (GBF) block 370, least reliable bit (LRB) selection block 380, and data chunk memory 395. It should be noted that any of the blocks shown in FIG. 3 could be eliminated and/or modified without departing from the teachings of the present disclosure.

In one embodiment, the LRB selection block 380 selects L least reliable bits based on received LLR values from the bits in the codeword. For example, the LRB selection block may select 10 least reliable bits out of 30 received bits. The GBF block 370 may select S bits (S=1, ..., L) among the L bits to flip. In one example, the GBF block 370 may generate $\Sigma_{i=1}^{i=S} C_i^L$ flipped patterns, which can be stored in flipped pattern buffer 360. As an example, if L=5, S=3, the GBF block 370 selects 10 patterns.

In the example TPC soft decoder shown in FIG. 3, two BCH decoders run in parallel. The first BCH decoder includes syndrome modification block 320, KES block 330, and Chien search block 340. The second BCH decoder includes syndrome modification block 325, KES block 335, and Chien search block 345. Therefore, the GBF block 370 generates two flipped patterns each time. It should be noted that any number of serial and/or parallel BCH decoders could be used in the TPC soft decoder, without departing from the teachings of the present disclosure. In case of P parallel decoders, the GBF block may generate P flipped patterns each time. The P flipped patterns may all be different from each other, or some of them may be similar, without departing from the teachings of the present disclosure.

The KES block 330 receives updated syndrome values that are modified based on the flipped patterns and finds error locator polynomial. Chien search 340 is then applied to find roots of error locator polynomial and generate decoded patterns.

Figure 6:
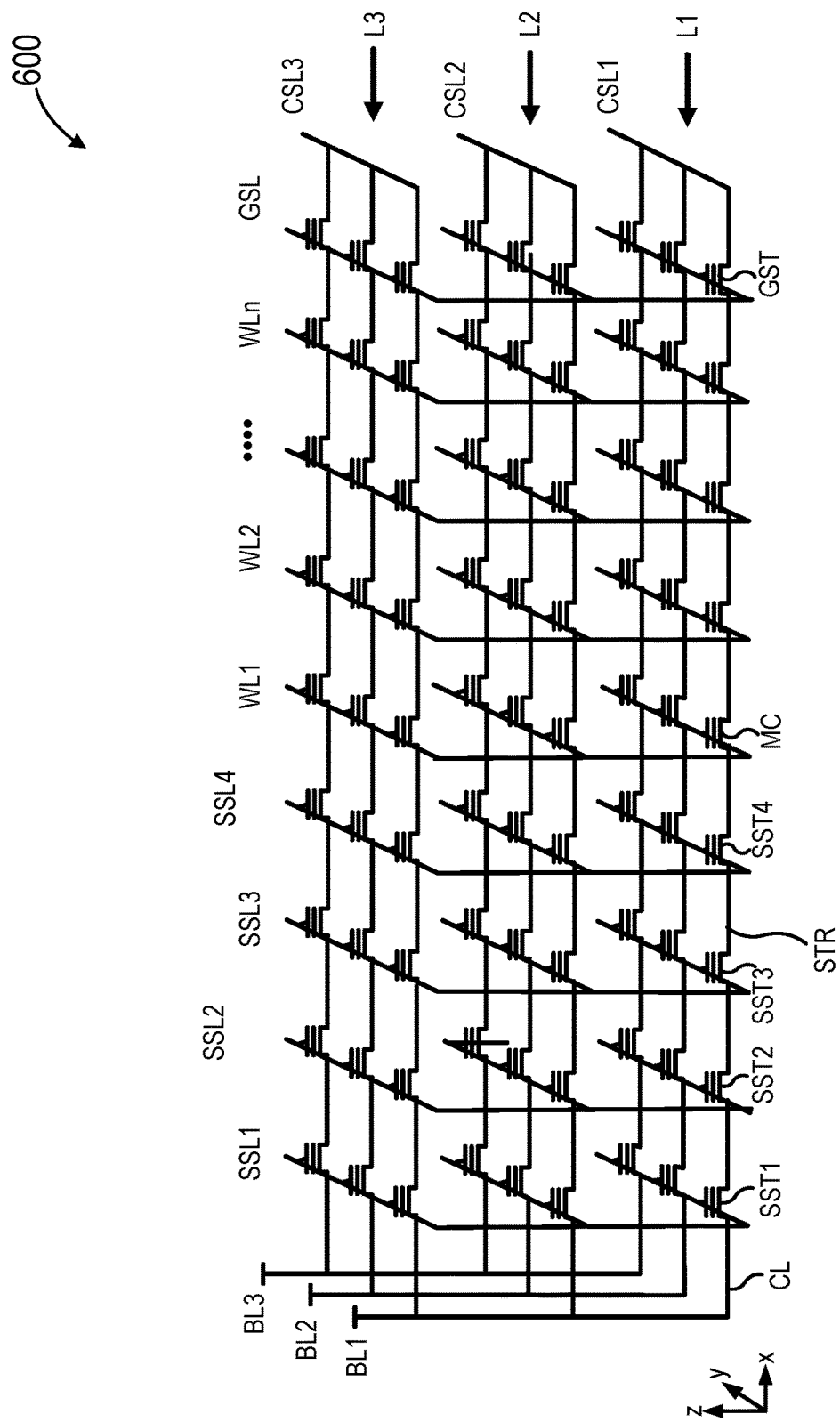
FIG. 6 is a simplified schematic diagram illustrating a 3-D NAND memory array in a 3-D non-volatile memory device in accordance with certain embodiments of the present disclosure.

In one embodiment, a MAT block 350 is used to reduce the probability of miscorrection by comparing the flipped and decoded patterns with LLR values. If the MAT block 350 detects a miscorrection, the decoded pattern is declared to be in error. If the MAT block does not detect a miscorrection (e.g., MAT condition is passed), the data and syndrome values will be updated according to the flipped and decoded patterns. In one embodiment, updated data value may be written in data chunk memory 395 and updated syndrome value may be written in syndrome memory 385. An example decoding flow chart corresponding to the TPC soft decoder is illustrated in FIG. 6.

Further details of hard decoding and soft decoding can be found in U.S. patent application Ser. No. 15/173,446, entitled "TECHNIQUES FOR LOW COMPLEXITY SOFT DECODER FOR TURBO PRODUCT CODES," filed Jan. 3, 2016, now U.S. Pat. No. 10,218,388, which is assigned to the assignee hereof and expressly incorporated by reference herein in its entirety.

Figure 4:
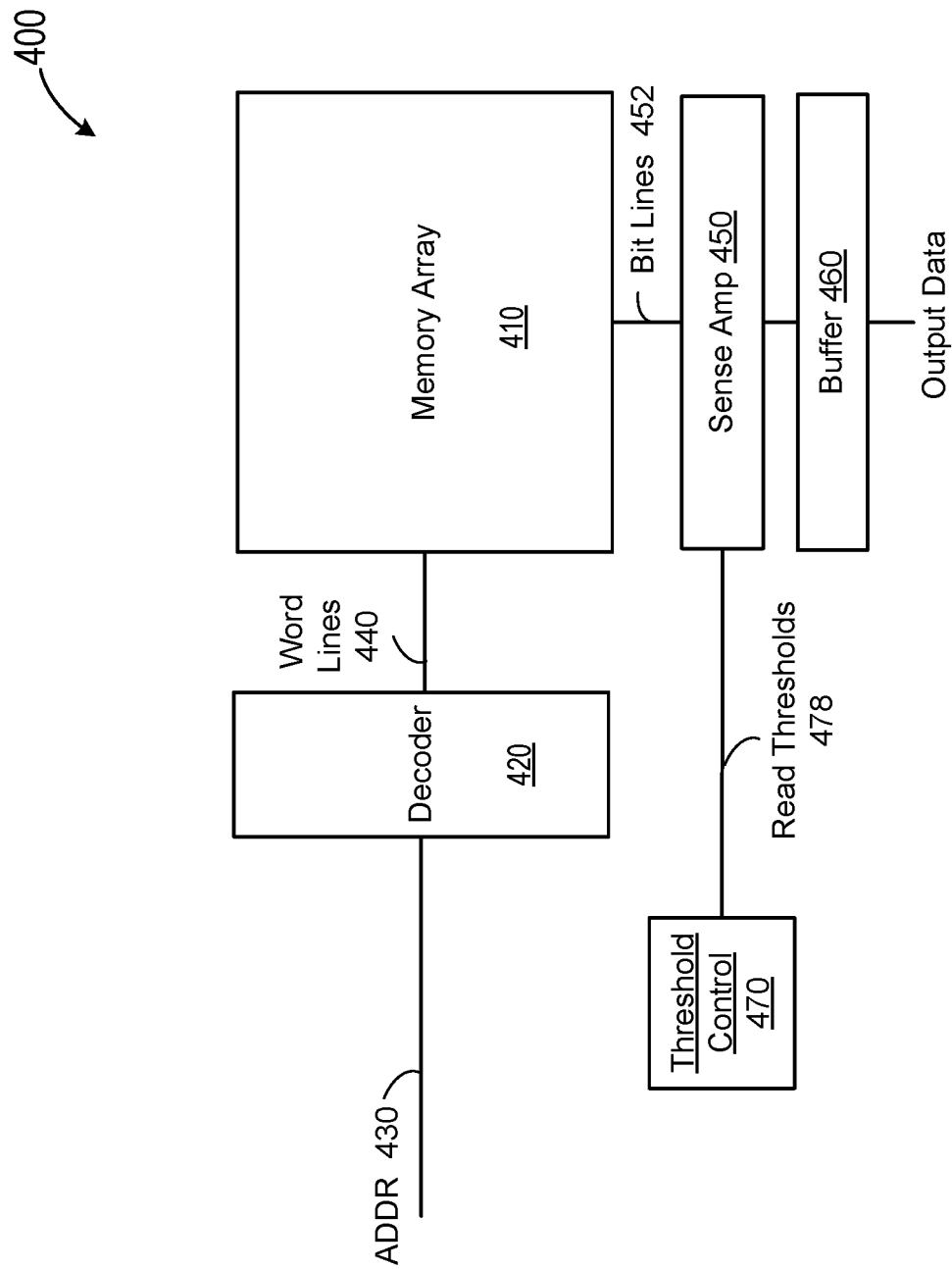
FIG. 4 is a simplified block diagram of a memory device in accordance with certain embodiments of the present disclosure.

FIG. 4 is a simplified block diagram of a memory device in accordance with certain embodiments of the present disclosure. As shown in FIG. 4, a flash memory device 400 can be an example of storage system 420 in the error correction system 400 in FIG. 4. Flash memory device 400 includes a memory cell array 410 having a plurality of non-volatile memory cells. In some embodiments, the memory cells are arranged in a plurality of memory blocks. Each memory block can include multiple non-volatile memory cells, each memory block being associated with a corresponding address. Memory device 400 also includes a decoder 420, for example, a row decoder. In an example, decoder 420 receives a command for a memory operation with an address ADDR 430, e.g., a read command with a read address. The address 430 can be a logic address. In an embodiment, the memory operations, such as read, write or program, and erase, etc., are directed to a group of memory cells, for example, a page or a sector, or a block. As described above, a block can include multiple pages. A read or program command is often directed to a page, and an erase command can be directed to a block. Depending on the embodiment, a page or a sector can be 0.5 Kbytes to 4 Kbytes, or a different size. Depending on the embodiments, a page or a sector can include memory cells coupled to the same word line. In this case, decoder 420 selects word lines (WL) 440 based on information on ADDR 430 for selecting a memory page, which can be a row of memory cells coupled to the selected word line. Therefore, pages and word lines are used interchangeably.

A sense amplifier block 450 is coupled to memory cell array 410 through bit lines 452. A buffer block 460 is coupled to sense amplifier block 450 and provides output data to an external device. In a read operation, sense amplifier block 450 senses the data stored in each memory cell of the memory cell array 410 and provides the data to buffer block 460. In a write or program operation, buffer block 460 presents the data to be written or programmed to the memory array 410.

During a memory read operation, the charges in a non-volatile memory cell selected by a word line are read out. Depending on the charges stored in a memory cell, its cell threshold voltage can vary. A read voltage higher than cell threshold voltage can be used to determine the data stored in the memory cell. In some embodiments, each of the non-volatile memory cells can be a multilevel memory cell, and multiple threshold voltages are used to determine the data state of the memory cell, as represented by a bit pattern. In these cases, a threshold control circuit 470, which provides read thresholds 478, can be used to control the threshold voltages.

Figure 5:
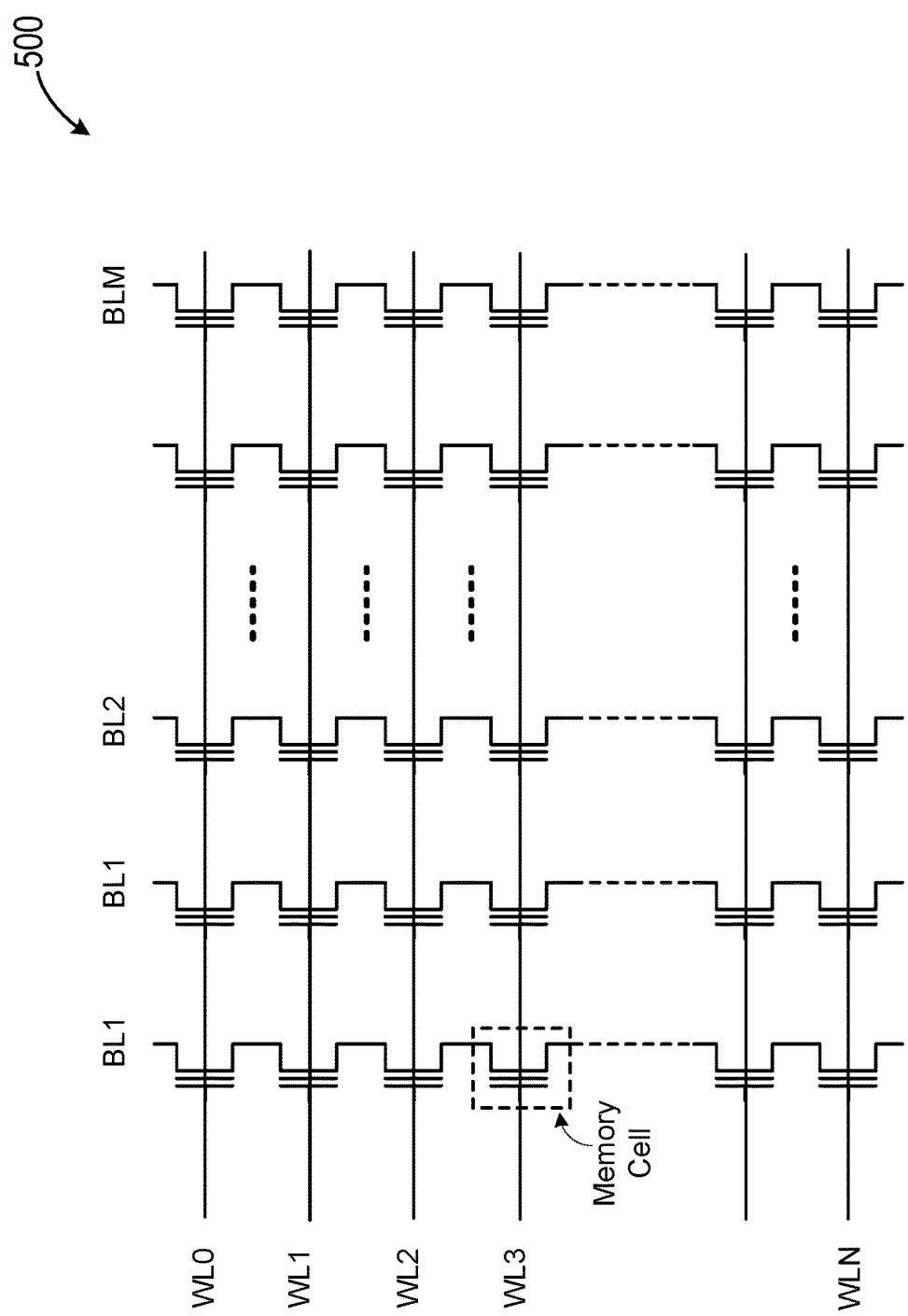
FIG. 5 is a simplified schematic diagram illustrating a memory array in accordance with certain embodiments of the present disclosure.

FIG. 5 is a simplified schematic diagram illustrating a memory array. FIG. 4 is a simplified block diagram of a memory device in accordance with certain embodiments of the present disclosure. As shown in FIG. 2, memory array 200 includes memory cells arranged in a two-dimensional array having rows and columns. Each row of memory cells is associated with a word line (WL), for example, WL0, WL1, WL2, WL3, . . . , WLN, etc. Each column of memory cells is associated with a bit line (BL), for example, BL1, BL2, BL3, . . . , BLM, etc. In some embodiments, the memory cells associated with each bit line can include multiple data bits and a parity bit derived from the data bits. For example, memory cells associated with bit line BL1 can have a parity bit stored in the memory cell coupled to word line WLN.

FIG. 6 is a simplified schematic diagram illustrating a 3-D NAND memory array in a 3-D non-volatile memory device in accordance with certain embodiments of the present disclosure. Memory array 600 includes a plurality of memory cells (MC) arranged in strings (STR) in a plurality of memory layers (in this example, three memory layers, L1, L2, and L3). Each of the memory layers includes a plurality of channel lines (CL) respectively coupled to a plurality of bitlines (BLs) via first ends of the plurality of channel lines (CL) and coupled to a common source line (CSLs) via second ends of the plurality of channel lines (CL). Memory array 600 also includes a plurality of string selection lines (SSL1-SSL4) coupled to string select transistors (SST1-SST3). Further, each of the memory layers also has a plurality of word lines (WL1 to WLn), and a ground selection line (GSL). The plurality of string selection lines (SSLs), the plurality of word lines (WLs), and the ground selection line (GSLs) intersect with the plurality of channel lines. Each of the plurality of channel lines defines a memory string (STR), and the memory string has string selection transistors (SSTs) respectively coupled with the plurality of string selection lines (SSLs). The common ground line GSL may be grounded to turn off common ground transistors GST.

The word lines WL1 to WLn may be connected to control gates of memory cells arranged in a column-wise direction, respectively. The bit lines BL1 to BL3 may be connected to the first ends of the string selection transistors, respectively. A plurality of memory cells having control gate electrodes coupled with the respective word lines WL1 to WLn, in a row-wise, direction may constitute a logical page, where a number of logical pages may be determined by a storage capacity of the memory cells.

In some of 3-D non-volatile memories, the memory cells in memory array 600 can store charges in charge trapping layers. In these example, multiple memory cells coupled to the same bit line can be stacked in a column of device structures. In such device structures, charge leaking between an upper cell and a lower cell can occur with long retention time of stored data. Further details of 3-D non-volatile memories can be found in U.S. Pat. No. 9,754,673, entitled "Method of Initializing and Driving 3D Non-volatile Memory Device Using Time Varying Erase Signal," the content of which is incorporated herein by reference in its entirety.

Figure 7:
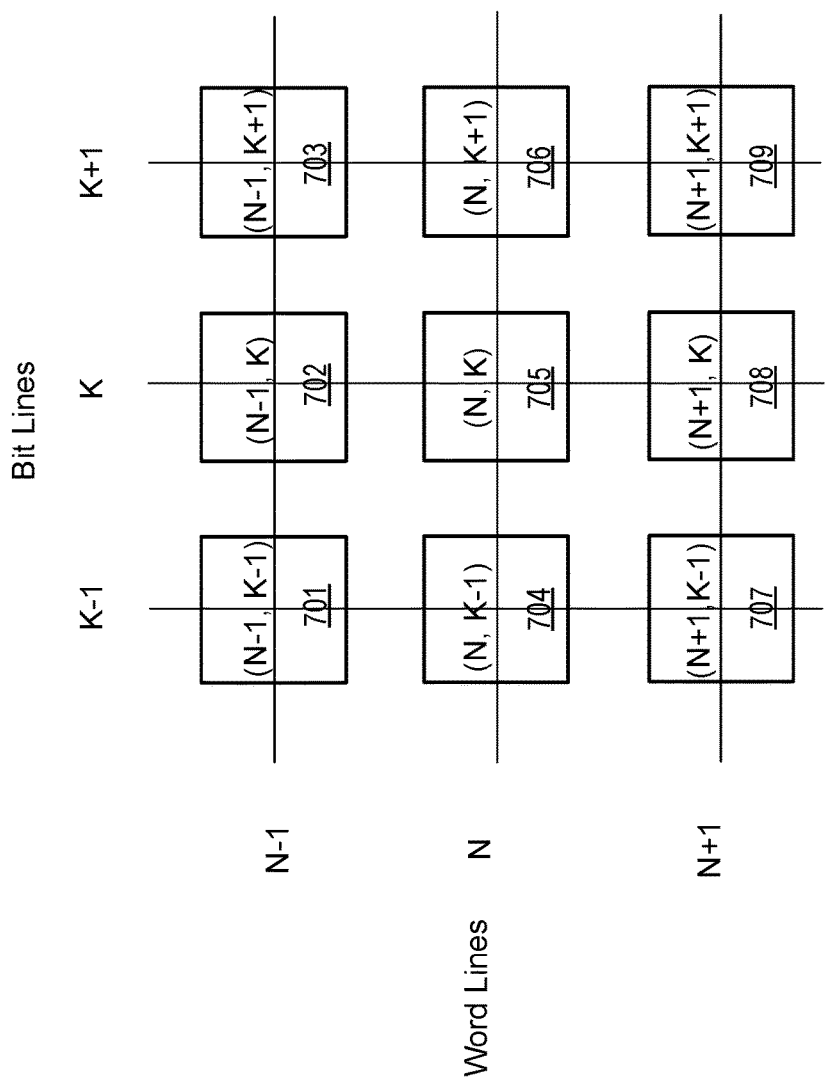
FIG. 7 is a simplified schematic diagram illustrating a portion of a memory array in a non-volatile memory device in accordance with certain embodiments of the present disclosure.

FIG. 7 is a simplified schematic diagram illustrating a portion 700 of a memory array in a non-volatile memory device in accordance with certain embodiments of the present disclosure. FIG. 4 illustrates a target cell at wordline N and bit line K designated as cell (N,K), also referred to as a victim cell, 705 surrounded by neighboring or adjacent cells from adjacent wordlines and bitlines. For example, cell 701 is at wordline N−1 and bitline K−1 designated as cell (N−1, K−1), cell 702 is at wordline N−1 and bitline K designated as cell (N−1, K), cell 703 is at wordline N−1 and bitline K+1 designated as cell (N−1, K+1), cell 704 is at wordline N and bitline K−1 designated as (N, K−1), cell 706 is at wordline N and bitline K+1 designated as cell (N, K+1), cell 707 is at wordline N+1 and bitline K−1 designated as cell (N+1, K−1), cell 708 is at wordline N+1 and bitline K designated as cell (N+1, K−1), and cell 709 is at wordline N+1 and bitline K+1 designated as cell (N+1, K+1). In a NAND memory, coupling capacitance exists between the target cell and the neighboring cells. Depending upon the data to be programmed into the cells, there is a change in the electric field of the target. This electric field can be reflected as a voltage threshold increase and can result in a different read cell voltage. Further, in some 3-D memories, such as those with charge trapping layers, as described in connection to FIG. 6, leakage of charges can occur between adjacent cells at different layers. In that case, the influence of neighboring cells can cause a negative shift in the threshold voltage of the target cell.

In embodiments of the disclosure, the interference or influence from neighboring cells in the target cell is modeled using the values of the log likelihood ratio (LLR) of each memory cell. Referring to the neighboring memory cells in FIG. 7, a linear model for interferences observed in the NAND data can be expressed as a weighted sum of LLR values of memory cells in a vicinity of the target memory cell (N, K) as follows, $$ELLR_k^N = [LLR_{k-1}^{N-1}, LLR_k^{N-1}, LLR_{k+1}^{N-1}, LLR_{k-1}^{N},$$
$$LLR_k^N, LLR_{k+1}^N, LLR_{k-1}^{N+1}, LLR_k^{N+1},$$
$$LLR_{k+1}^{N+1}].$$

$$[W_{k-1}^{N-1}, W_k^{N-1}, W_{k+1}^{N-1}, W_{k-1}^N, W_k^N, W_{k+1}^N,$$
$$W_{k-1}^{N+1}, W_k^{N+1}, W_{k+1}^{N+1}]^T \quad (1)$$

where $ELLR_k^N$ is the estimated LLR for kth bit, and Nth wordline and $LLR_{k-1}^{N-1}$ is LLR for (k−1)th bit and (N−1)th wordline, and so on. W denotes weight coefficients, also referred to as coupling coefficients, due to several interferences from neighboring cells.

As an example, in the model in equation (1), there is no interference present if the following constraints are true, $$W_{k-1}^{N-1} = W_k^{N-1} = W_{k+1}^{N-1} = W_{k-1}^N = W_{k+1}^N = W_{k-1}^{N+1} =$$
$$W_k^{N+1} = W_{k+1}^{N+1} = 0 \text{ and } W_k^N = 1.$$

If there is interference present for neighboring wordlines but not from bitlines, the following constraints are true, $$W_{k-1}^{N-1} \neq 0, W_k^{N-1} \neq 0, W_{k+1}^{N-1} \neq 0, W_{k-1}^{N+1} \neq 0,$$
$$W_k^{N+1} \neq 0, W_{k+1}^{N+1} \neq 0, W_k^N \neq 0 \text{ and } W_{k-1}^N = W_{k+1}^N = 0.$$

If there is interference from bitlines and no interference from neighboring wordlines, the following constraints are true, $$W_{k-1}^{N-1} = W_k^{N-1} = W_{k+1}^{N-1} = W_{k-1}^{N+1} = W_k^{N+1} =$$
$$W_{k+1}^{N+1} = 0, W_k^N \neq 0 \text{ and } W_{k-1}^N \neq 0, W_{k+1}^N \neq 0.$$

The model in (1) is general and can handle interference from bitline and wordline directions. If L points are given for the estimated LLR values, the equation (1) can be rewritten as, $$\overline{B} = \overline{AX}(PEC, RET, RD) \quad (2)$$

where
$\overline{B}$ is a vector of dimension L for estimated LLR values, ELLR, for L memory cells, where L is an integer;

$$\overline{B} = [{}^1ELLR_k^N, {}^2ELLR_k^N, \ldots, {}^LELLR_k^N],$$

$\overline{A}$ is a matrix of LLR values of memory cells in the vicinity of each of the L memory cells;

$$\overline{A} = [[{}^1LLR_{k-1}^{N-1}, {}^1LLR_k^{N-1}, {}^1LLR_{k+1}^{N-1}, {}^1LLR_{k-1}^N, {}^1LLR_k^N,$$
$$ {}^1LLR_{k+1}^N, {}^1LLR_{k-1}^{N+1}, {}^1LLR_k^{N+1}, {}^1LLR_{k+1}^{N+1}],$$
$$\ldots$$
$$[{}^LLLR_{k-1}^{N-1}, {}^LLLR_k^{N-1}, {}^LLLR_{k+1}^{N-1},$$
$$ {}^LLLR_{k-1}^N, {}^LLLR_k^N, {}^LLLR_{k+1}^N,$$
$$ {}^LLLR_{k-1}^{N+1}, {}^LLLR_k^{N+1}, {}^LLLR_{k+1}^{N+1}]]].$$

$\overline{X}$ is a vector of weight coefficients relating $\overline{A}$ and $\overline{B}$, and is expressed as a function of $\overline{B} = \overline{AX}$, wherein the solution is expressed as $$\overline{X} = [W_{k-1}^{N-1}, W_k^{N-1}, W_{k+1}^{N-1}, W_{k-1}^N, W_k^N, W_{k+1}^N, W_{k-1}^{N+1}, W_k^{N+1},$$
$$W_{k+1}^{N+1}]^T.$$

The closed form solution for equation (2) can be given as, $$\overline{X}(PEC, RET, RD) = (\overline{A}^T\overline{A})^{-1}\overline{A}^T\overline{B}. \quad (3)$$

The solution in (3) can be determined from offline from training data. Quantized values of $\overline{X}(PEC, RET, RD)$ can be used for hardware implementation. Direct inversion of matrix is difficult to perform on the hardware for on the fly weight coefficients update. For example, in a 4K-byte page read operation, 32K bits of data are obtained, and a matrix of 32K by 32K would be involved in direct matrix inversion. The computational complexity can increase exponentially with the block size. Any update is not easily performed on the fly on the hardware for updating $\overline{X}$.

As an example, offline training can include writing a known bit pattern having a known number of binary 1s and 0s to a memory array, reading the cells in the memory array multiple times with different reference voltages. From the cell voltages obtained from the reading, LLR values can be determined, and the weight coefficients between LLRs of neighboring cells can be calculated, e.g., by matrix inversion as described above.

In some cases, the vector $\overline{X}$ and the solution $\overline{X}$ are functions of one or more of program/erase cycles (PEC), retention time (RET), and read disturb (RD), and the solution to the equation $\overline{B} = \overline{AX}(PEC, RET, RD)$ is expressed as:

$$\overline{X}(PEC, RET, RD) = (\overline{A}^T\overline{A})^{-1}\overline{A}^T\overline{B}. \quad (4)$$

In alternative embodiments, a recursive or iterative solution to equation (2) can be found by formulating a minimum mean square error (MMSE) estimator problem for finding optimal $\overline{X}(PEC, RET, RD)$ as, $$\overline{X}(PEC, RET, RD) = \operatorname{argmin}_{\nabla \overline{X}} |\overline{AX}(PEC, RET, RD) - \overline{B}|^2. \quad (5)$$

In some embodiments, the MMSE recursive update idea can be used for on the fly update. The update equation is given as, $$\overline{X}_{i+1} = \overline{X}_i - \mu \cdot \overline{A}^T \cdot (\overline{AX}(PEC, RET, RD) - \overline{B}). \quad (4)$$

where $\overline{X}_{i+1}$ are the updated weight coefficients at the (i+1)th instant, and μ is the adaptation coefficient whose value can be selected heuristically to optimize convergence of the update equation (4). The MMSE recursive update can be carried out using known hardware implementation.

Figure 8:
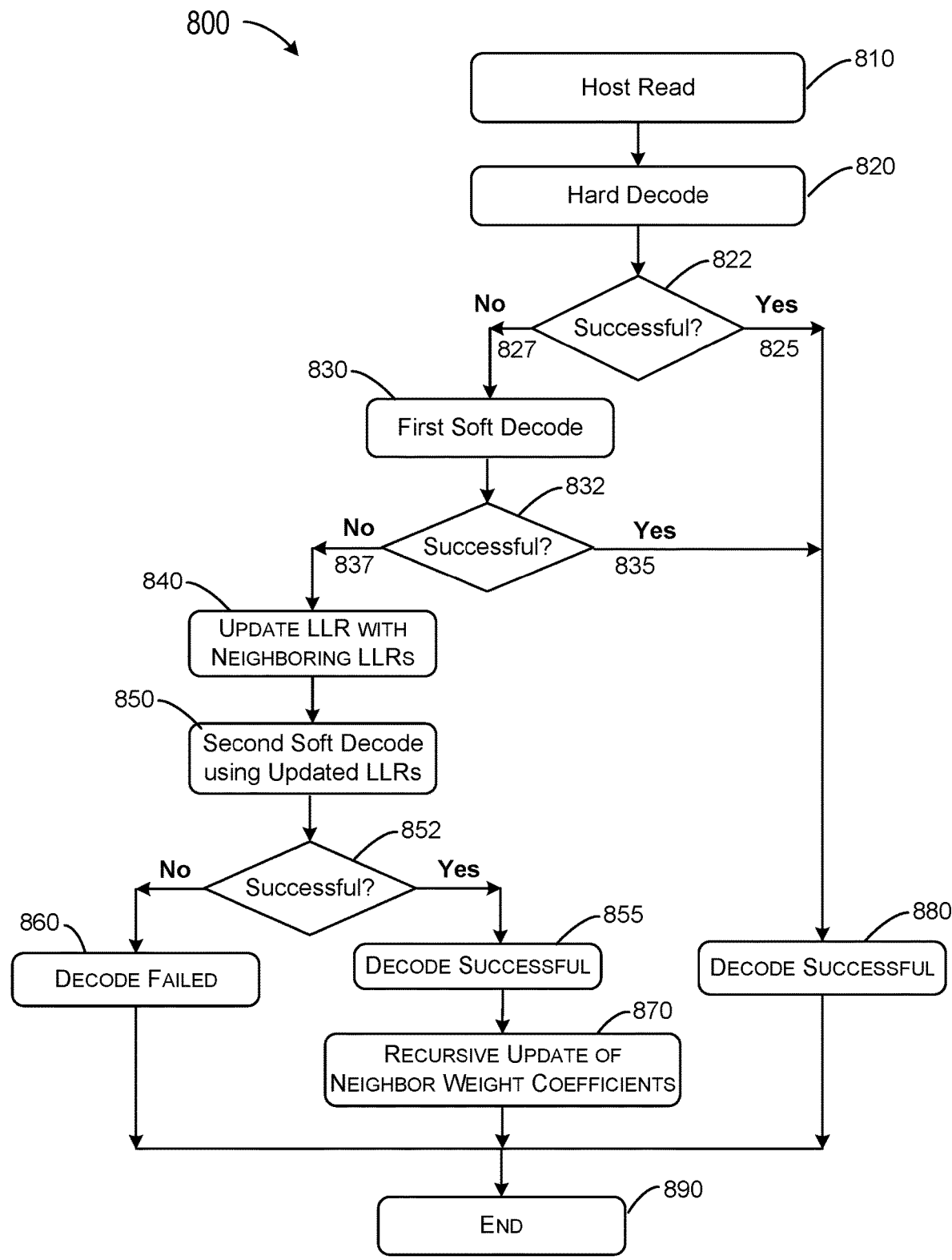
FIG. 8 is a simplified flowchart illustrating a method for operating a memory device in accordance with certain embodiments of the present disclosure.
Figure 9:
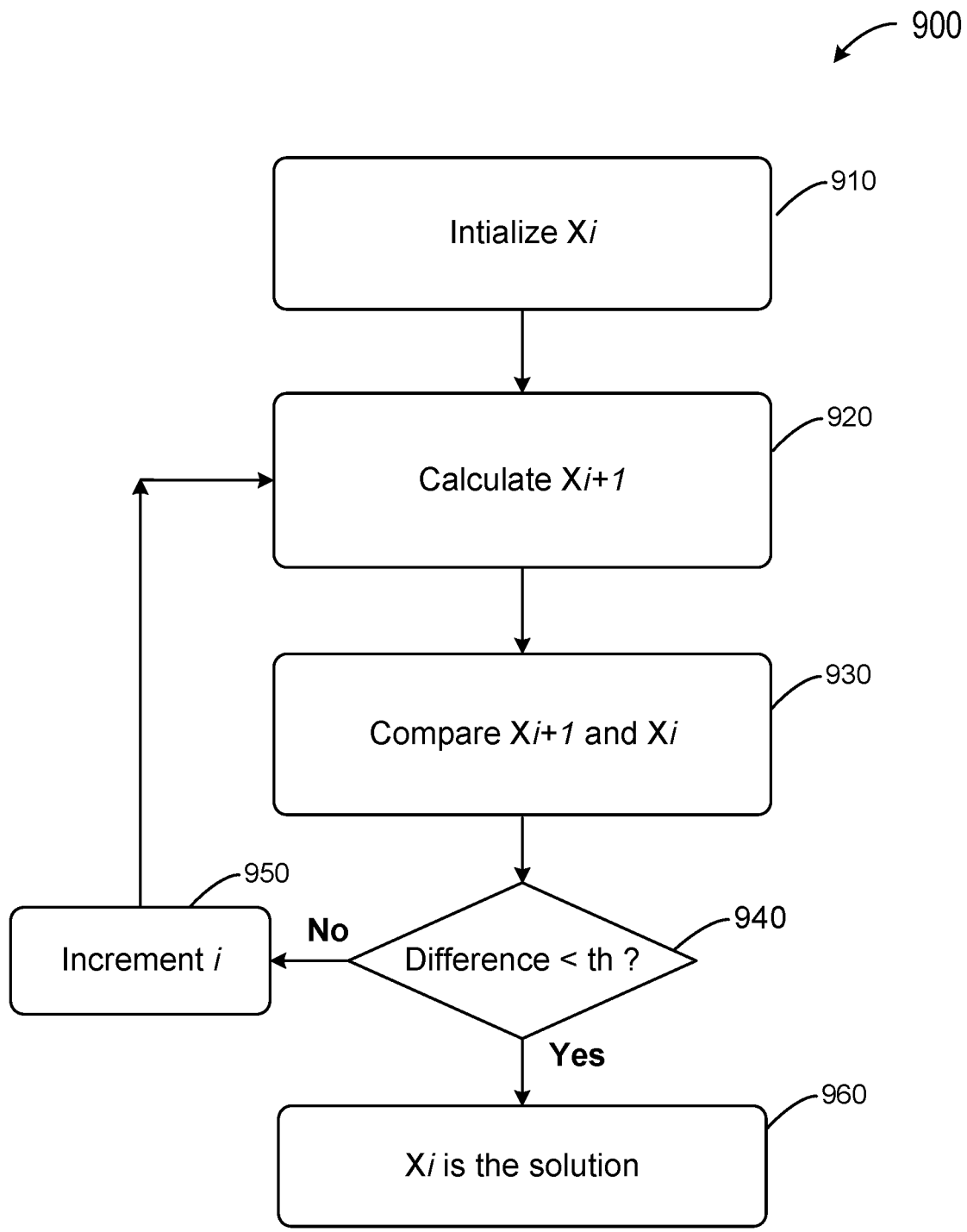
FIG. 9 is a simplified flowchart illustrating a method for recursive update of neighbor weight coefficients in accordance with certain embodiments of the present disclosure.

In embodiments of the disclosure, interference from neighboring cells can be taken into account by updating the value of LLR of a target cell by finding optimal weight coefficients, or coupling coefficients, from the values of LLRs from neighboring cells. The updated LLR values can then be used in decoding for more accurate results. FIG. 8 is a simplified flowchart 800 illustrating a read operation of a non-volatile data storage device in accordance with certain embodiments of the present disclosure, and FIG. 9 is a simplified flowchart illustrating a method for recursive update of neighbor weight coefficients in accordance with certain embodiments of the present disclosure. The methods of optimizing the LLR used in the nonvolatile memory device according to the embodiments are described using NAND flash memories as an example. However, it is appreciated that these methods may be used in other non-volatile memory devices such as Phase Change Random Access Memory (PRAM), a Resistance Random Access Memory (RRAM), a Magnetic Random Access Memory (MRAM), or a Ferroelectric random access memory (FRAM), etc.

FIG. 8 is a simplified flowchart illustrating an operation of a non-volatile data storage device in accordance with certain embodiments of the present disclosure. The non-volatile data storage device includes memory cells arranged in a two-dimensional array having rows and columns, each row associated with a word line and each column associated with a bit line, and a memory controller coupled to the memory cells for controlling operations of the memory cells. Examples of a memory device are described in connection with FIGS. 4-6 and FIG. 10.

In FIG. 8, at 810, the memory controller is configured to perform a read operation in response to a read command from a host. At 820, the memory controller performs hard decoding of data from the read operation and, at 822, determines whether the hard decoding is successful. The decoding is considered successful when no errors are found, or all errors are correctable, where no errors are uncorrected. If the hard decoding is successful, at 825, the memory controller determines that the read operation is successful (880) and presents the data to the host. On the other hand, if the hard decoding is unsuccessful (827), the memory controller performs a first soft decoding, at 830, using existing LLR (log likelihood ratio) values stored in the memory controller. At 832, the memory controller determines if the first soft decoding is successful wherein no errors are uncorrected. If the first soft decoding is successful (835), the memory controller determines that the read operation is successful (880) and presents the data to the host.

If the first soft decoding is unsuccessful (837), the memory controller updates LLR values using LLR values from neighboring memory cells and existing weight coefficients that account for influence from the neighboring memory cells, at 840. In some embodiments of the above non-volatile data storage device, an estimated LLR value for a memory cell, at wordline N and bit line K, $ELLR_k^N$, can be expressed as a weighted sum of LLR values of memory cells in a vicinity of the target memory cell in the following linear equation:

$$ELLR_k^N = [LLR_{k-1}^{N-1}, LLR_k^{N-1}, LLR_{k+1}^{N-1}, LLR_{k-1}^N,$$
$$LLR_k^N, LLR_{k+1}^N, LLR_{k-1}^{N+1}, LLR_k^{N+1},$$
$$LLR_{k+1}^{N+1}].$$

$$[W_{k-1}^{N-1}, W_k^{N-1}, W_{k+1}^{N-1}, W_{k-1}^N, W_k^N, W_{k+1}^N,$$
$$W_{k-1}^{N+1}, W_k^{N+1}, W_{k+1}^{N+1}]^T, \quad (1)$$

wherein:

$LLR_j^i$ is the LLR value for a neighboring memory cell at (i)th bitline and (j)th wordline; and $W_j^i$ is a weight coefficient relating estimated LLR for a memory cell at wordline N and bit line K, $ELLR_k^N$, to an LLR, wherein N, K, i, and j are integers, and the superscript T denotes a transpose of a vector or matrix.

In some embodiments, initial existing weight coefficients are determined by finding a solution, offline using training data, to the following equation, $$\overline{B} = \overline{AX}$$

where:

$\overline{B}$ is a vector of dimension L for estimated LLR values, ELLR, for L memory cells, where L is an integer;

$\overline{A}$ is a matrix of LLR values of memory cells in the vicinity of each of the L memory cells; and $\overline{X}$ is a vector of weight coefficients relating $\overline{A}$ and $\overline{B}$, and is expressed as a function of $\overline{B} = \overline{AX}$, wherein the solution is expressed as $$\overline{X} = (\overline{A}^T \overline{A})^{-1} \overline{A}^T \overline{B}.$$

In some embodiments, the vector $\overline{X}$ and the solution $\overline{X}$ are functions of one or more of program/erase cycles (PEC), retention time (RET), and read disturb (RD), and the solution to the equation $\overline{B} = \overline{AX}(PEC, RET, RD)$ is expressed as:

$$\overline{X}(PEC, RET, RD) = (\overline{A}^T \overline{A})^{-1} \overline{A}^T \overline{B}.$$

At 850, the memory controller performs a second soft decoding using the updated LLR values and, at 852, determines whether the second soft decoding is successful wherein no errors are uncorrected. If the second soft decoding is unsuccessful, at 860, the memory controller determines that the read operation has failed. If the second soft decoding is successful, at 855, the memory controller determines that the decoding is successful, and presents decoded data to the host.

Further, if the second soft decoding is successful, the memory controller performs a recursive update of weight coefficients, at 870, to reflect updated influence from neighboring memory cells. In some embodiments, the recursive update of the weight coefficients includes recursively finding an optimal $\overline{X}$ in a minimum mean square error (MMSE) estimator to minimize the difference between $\overline{AX}$ and $\overline{B}$, formulated as the following equation:

$$\overline{X}(PEC, RET, RD) = \mathrm{argmin}_{\nabla \overline{X}} |\overline{AX}(PEC, RET, RD) - \overline{B}|^2$$

wherein the update equation is given as, $$\overline{X}_{i+1} = \overline{X}_i - \mu \cdot \overline{A}^T \cdot (\overline{AX}(PEC, RET, RD) - \overline{B})$$

where $\overline{X}_{i+1}$ are the updated weight coefficients at the (i+1)th instant with i being an integer, and $\mu$ is an adaptation coefficient whose value can be selected heuristically to optimize convergence of the MMSE update equation.

The memory controller can also store the recursively updated weight coefficient in the memory controller for use in further decoding. The operation ends at 890, where the data read in by the system has either succeeded or failed.

In some embodiments, the recursive update of the weight coefficients comprises updating the weight coefficients on the fly with a successful read operation.

In some embodiments, the memory controller is further configured to estimate weight coefficients using a function of program erase cycles (PEC), read disturb (RD), and retention (RET), and apply neighbor assisted and bitline interference corrections on the data with the weight coefficients.

According to some embodiments of the disclosure, a decoding method can include reading data from word lines adjacent to a target word line when a decoding is fail, estimating coupling coefficients using a function of program erase cycles (PEC), read disturb (RD) and retention (RET), and applying neighbor assisted and bitline interference correction on the data with the coupling coefficients. The method can also include decoding the corrected data, and applying recursive updating with the decoded data to update the coupling coefficients, when the decoding is successful.

In some embodiments, the memory controller is further configured to perform soft decoding using the recursively updated weight coefficients on the fly after a successful soft decoding.

FIG. 9 is a simplified flowchart 900 illustrating a method for recursive update of neighbor weight coefficients in accordance with certain embodiments of the present disclosure. As illustrated in FIG. 9, the method includes finding an optimal $\overline{X}$ in a minimum mean square error (MMSE) estimator to minimize the difference between $\overline{AX}$ and $\overline{B}$, formulated as the following equation:

$$\overline{X}(PEC, RET, RD) = \mathrm{argmin}_{\nabla \overline{X}} |\overline{AX}(PEC, RET, RD) - \overline{B}|^2$$

wherein the update equation is given as, $$\overline{X}_{i+1} = \overline{X}_i - \mu \cdot \overline{A}^T \cdot (\overline{AX}(PEC, RET, RD) - \overline{B})$$

where $\overline{X}_{i+1}$ are the updated weight coefficients at the (i+1)th instant with i being an integer, and $\mu$ is an adaptation coefficient whose value can be selected heuristically to optimize convergence of the MMSE update equation.

As illustrated in FIG. 9, at 910, the method includes selecting an initial value for $\overline{X}_i$. At 920, the method includes calculating $\overline{X}_{i+1}$ from the equation:

$$\overline{X}_{i+1} = \overline{X}_i - \mu \cdot \overline{A}^T \cdot (\overline{AX}(PEC, RET, RD) - \overline{B}).$$

Here, the initial value for $\overline{X}_i$ can be selected at random or heuristically, e.g., based on historical data. Further, μ is an adaptation coefficient whose value can be selected heuristically to optimize convergence of the MMSE update equation.

At 930, the method compares $\overline{X}_{i+1}$ and $\overline{X}_i$, and, at 940, the method determines a difference between compares $\overline{X}_{i+1}$ and $\overline{X}_i$. At 950, if the difference is greater than a threshold "th," the method repeats the above processes. At 960, if the difference is less than the threshold "th," the method determines that $\overline{X}_i$ is the updated weight coefficients. At 970, the method includes storing the updated weight coefficients in the memory controller. In the above description, the threshold "th" can be selected to shorten the convergence time or depending on the desired accuracy.

Figure 10:
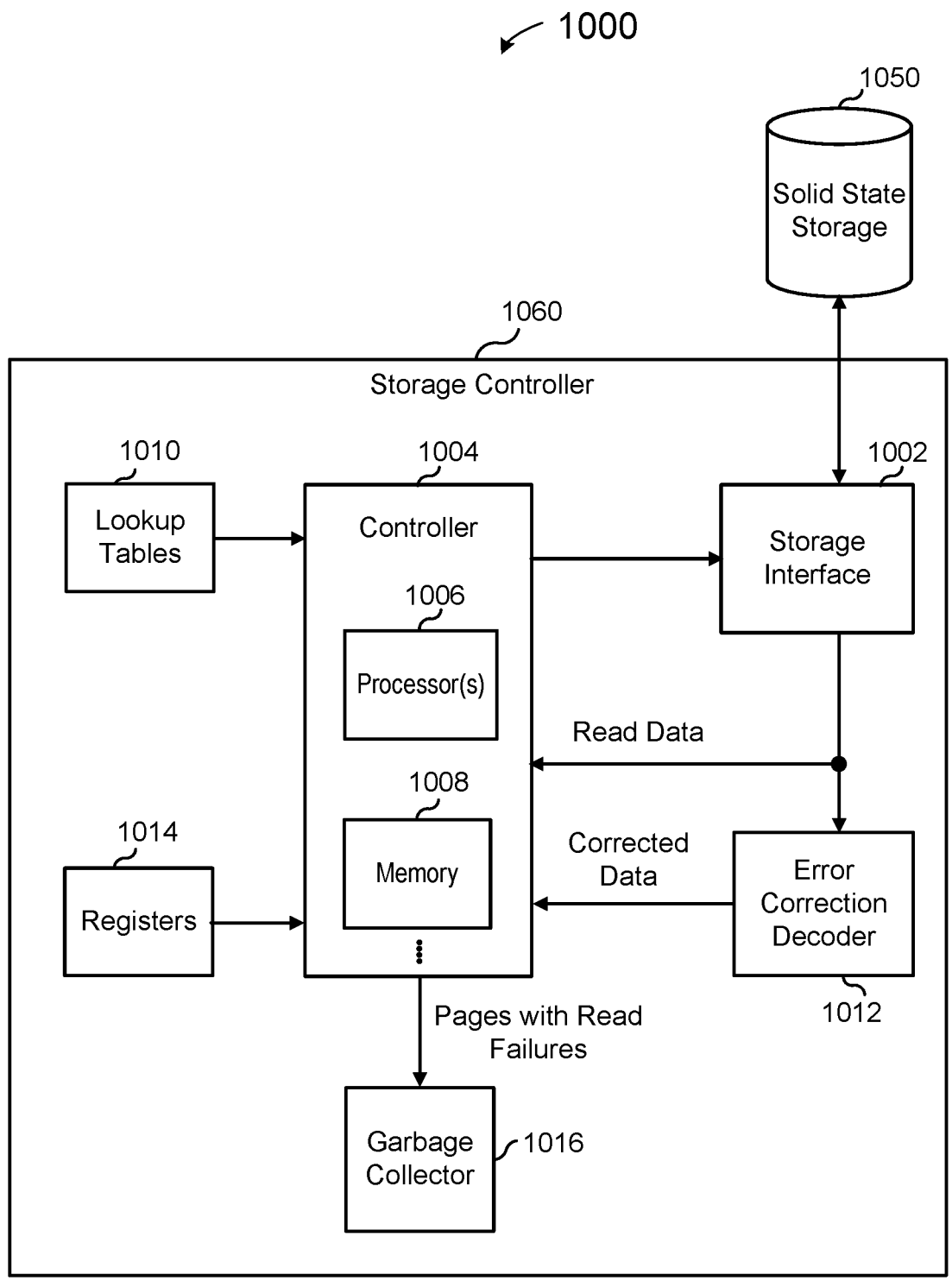
FIG. 10 is a simplified block diagram illustrating a solid state storage system in accordance with certain embodiments of the present disclosure.

FIG. 10 is a simplified block diagram illustrating a solid state storage system in accordance with certain embodiments of the present disclosure. As shown, solid state storage system 1000 can include a solid state storage device 1050 and a storage controller 1060. For example, solid state storage device 1050 can include a flash memory device 100 as depicted in FIG. 1. Storage controller 1060, also referred to as a memory controller, is one example of a system which performs the techniques described herein. In some embodiments, storage controller 1060 can be implemented on a semiconductor device, such as an ASIC or FPGA. Some of the functions can also be implemented in firmware.

Controller 1004 can include one or more processors 1006 and memories 1008 for performing the control functions described above. Storage controller 1060 can also include lookup tables 1010, which can include a table for degraded blocks and a table for bad blocks, etc. Registers 1014 can be used to store data for control functions, such as threshold values for degraded block counts, etc.

Controller 1004 can be coupled to solid state storage 1050 through a storage interface 1002. Error correction decoder 1012 (e.g., an LDPC decoder or a BCH decoder) can perform error correction decoding on the read data and sends the corrected data to controller 1004. Controller 1004 can identify the pages with read failures to garbage collector 1016, which performs corrective processing on those pages (e.g., by copying the data, with or without error correction decoding, to a new location).

Figure 11:
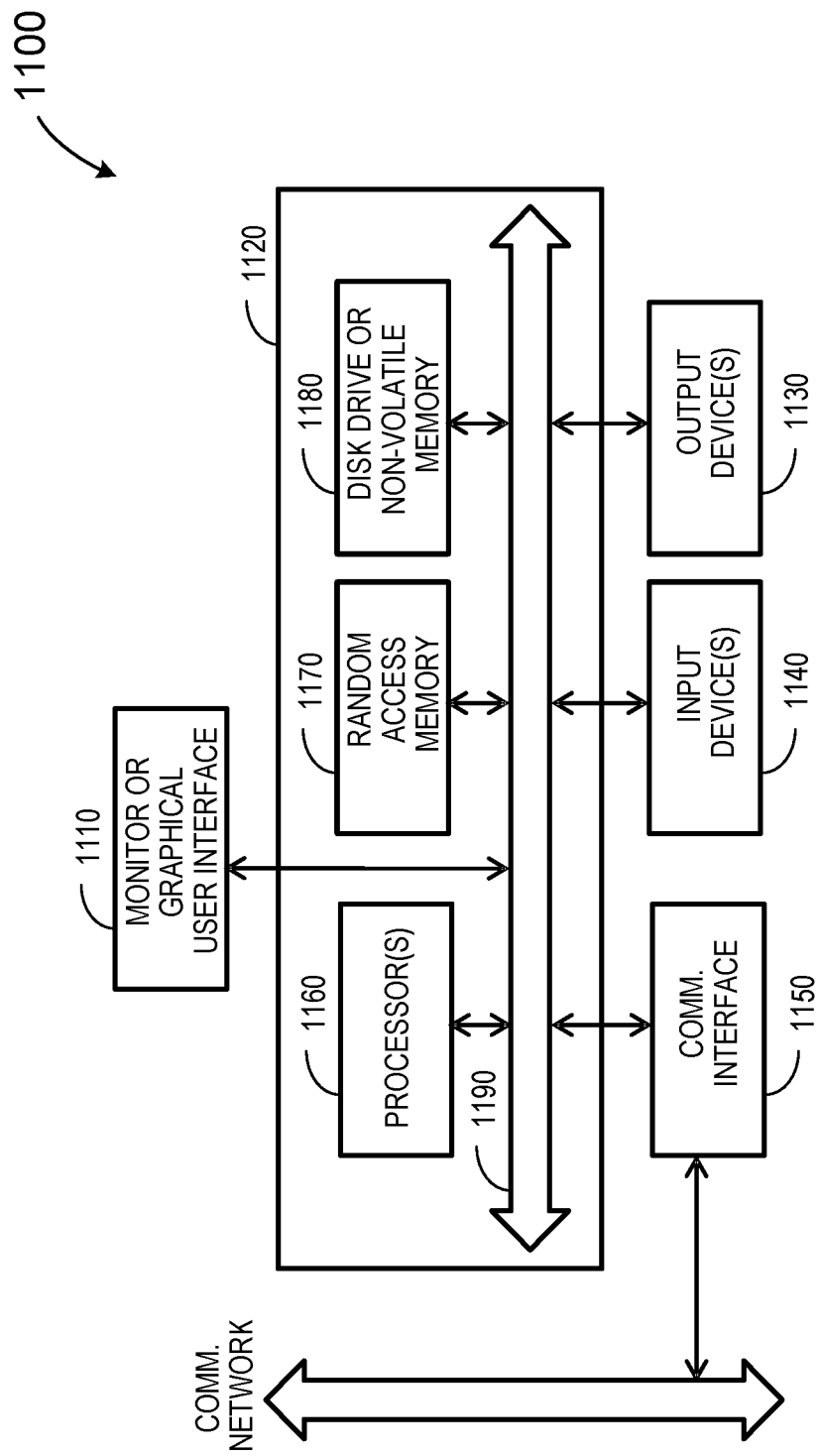
FIG. 11 is a simplified block diagram illustrating an apparatus that may be used to implement various embodiments according the present disclosure.

FIG. 11 is a simplified block diagram illustrating an apparatus that may be used to implement various embodiments according the present disclosure. FIG. 11 is merely illustrative of an embodiment incorporating the present disclosure and does not limit the scope of the invention as recited in the claims. One of ordinary skill in the art would recognize other variations, modifications, and alternatives. In one embodiment, computer system 1100 typically includes a monitor 1110, a computer 1120, user output devices 1130, user input devices 1140, communications interface 1150, and the like.

As shown in FIG. 11, computer 1120 may include a processor(s) 1160 that communicates with a number of peripheral devices via a bus subsystem 1190. These peripheral devices may include user output devices 1130, user input devices 1140, communications interface 1150, and a storage subsystem, such as random access memory (RAM) 1170 and disk drive 1180. As an example, a disk drive can include solid state disk (SSD) implemented with non-volatile memory devices such as memory device 100 depicted in FIG. 1 with features described above.

User input devices 1140 include all possible types of devices and mechanisms for inputting information to computer system 1120. These may include a keyboard, a keypad, a touch screen incorporated into the display, audio input devices such as voice recognition systems, microphones, and other types of input devices. In various embodiments, user input devices 1140 are typically embodied as a computer mouse, a trackball, a track pad, a joystick, wireless remote, drawing tablet, voice command system, eye tracking system, and the like. User input devices 1140 typically allow a user to select objects, icons, text and the like that appear on the monitor 1110 via a command such as a click of a button or the like.

User output devices 1130 include all possible types of devices and mechanisms for outputting information from computer 1120. These may include a display (e.g., monitor 1110), non-visual displays such as audio output devices, etc.

Communications interface 1150 provides an interface to other communication networks and devices. Communications interface 1150 may serve as an interface for receiving data from and transmitting data to other systems. Embodiments of communications interface 1150 typically include an Ethernet card, a modem (telephone, satellite, cable, ISDN), (asynchronous) digital subscriber line (DSL) unit, FireWire interface, USB interface, and the like. For example, communications interface 1150 may be coupled to a computer network, to a FireWire bus, or the like. In other embodiments, communications interfaces 1150 may be physically integrated on the motherboard of computer 1120, and may be a software program, such as soft DSL, or the like.

In various embodiments, computer system 1100 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 1120 includes one or more Xeon microprocessors from Intel as processor(s) 1160. Further, one embodiment, computer 1120 includes a UNIX-based operating system.

RAM 1170 and disk drive 1180 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 1170 and disk drive 1180 may be configured to store the basic programming and data constructs that provide the functionality of the present invention.

Software code modules and instructions that provide the functionality of the present invention may be stored in RAM 1170 and disk drive 1180. These software modules may be executed by processor(s) 1160. RAM 1170 and disk drive 1180 may also provide a repository for storing data used in accordance with the present invention.

RAM 1170 and disk drive 1180 may include a number of memories including a main random access memory (RAM) for storage of instructions and data during program execution and a read only memory (ROM) in which fixed non-transitory instructions are stored. RAM 1170 and disk drive 1180 may include a file storage subsystem providing persistent (non-volatile) storage for program and data files. RAM 1170 and disk drive 1180 may also include removable storage systems, such as removable flash memory.

Bus subsystem 1190 provides a mechanism for letting the various components and subsystems of computer 1120 communicate with each other as intended. Although bus subsystem 1190 is shown schematically as a single bus, alternative embodiments of the bus subsystem may utilize multiple busses. Bus system 1190 may be a PCI Express bus that may be implemented using PCIe PHY embodiments of the present disclosure.

FIG. 11 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The embodiments disclosed herein are not to be limited in scope by the specific embodiments described herein. Various modifications of the embodiments of the present invention, in addition to those described herein, will be apparent to those of ordinary skill in the art from the foregoing description and accompanying drawings. Further, although some of the embodiments of the present invention have been described in the context of a particular implementation in a particular environment for a particular purpose, those of ordinary skill in the art will recognize that its usefulness is not limited thereto and that the embodiments of the present invention can be beneficially implemented in any number of environments for any number of purposes.

What is claimed is:

1. A non-volatile data storage device, comprising:
memory cells arranged in a two-dimensional array having rows and columns, each row associated with a word line and each column associated with a bit line;
a memory controller coupled to the memory cells for controlling operations of the memory cells;
wherein the memory controller is configured to:
perform a read operation in response to a read command from a host;
perform hard decoding of data from the read operation;
determine whether the hard decoding is successful wherein no errors are uncorrected;
if the hard decoding is successful, determine that the read operation is successful and present the data to the host;
if the hard decoding is unsuccessful, perform a first soft decoding using existing LLR (log likelihood ratio) values stored in the memory controller;
determine if the first soft decoding is successful wherein no errors are uncorrected;
if the first soft decoding is successful, determine that the read operation is successful and present the data to the host;
if the first soft decoding is unsuccessful:
update existing LLR values using LLR values from neighboring memory cells and existing weight coefficients that account for influence from the neighboring memory cells;
perform a second soft decoding using the updated LLR values;
determine whether the second soft decoding is successful wherein no errors are uncorrected;
if the second soft decoding is unsuccessful, determine that the read operation has failed;
if the second soft decoding is successful:
determine that the decoding is successful;
present decoded data to the host;
perform a recursive update of weight coefficients to reflect updated influence from neighboring memory cells; and
store the recursively updated weight coefficients in the memory controller for use in further decoding.

2. The non-volatile data storage device of claim 1, wherein an estimated LLR value for a memory cell at wordline N and bit line K, $ELLR_k^N$, is expressed as a weighted sum of LLR values of memory cells in a vicinity of the memory cell in the following linear equation:

$$ELLR_k^N = [LLR_{k-1}^{N-1}, LLR_k^{N-1}, LLR_{k+1}^{N-1}, LLR_{k-1}^N,\\ LLR_k^N, LLR_{k+1}^N, LLR_{k-1}^{N+1}, LLR_k^{N+1},\\ LLR_{k+1}^{N+1}].$$

$$[W_{k-1}^{N-1}, W_k^{N-1}, W_{k+1}^{N-1}, W_{k-1}^N, W_k^N, W_{k+1}^N,\\ W_{k-1}^{N+1}, W_k^{N+1}, W_{k+1}^{N+1}]^T,$$

wherein:
  $LLR_j^i$ is the LLR value for a neighboring memory cell at (i)th bitline and (j)th wordline; and
  $W_j^i$ is a weight coefficient relating estimated LLR for a memory cell at wordline N and bit line K, $ELLR_k^N$, to an LLR,
  wherein N, K, i, and j are integers, and the superscript T denotes a transpose of a vector or matrix.

3. The non-volatile data storage device of claim 2, wherein initial existing weight coefficients are determined by finding a solution, offline using training data, to the following equation, $$\overline{B} = \overline{A}\overline{X}$$

wherein:
  $\overline{B}$ is a vector of dimension L for estimated LLR values, ELLR, for L memory cells, where L is an integer;
  $\overline{A}$ is a matrix of LLR values of memory cells in the vicinity of each of the L memory cells; and
  $\overline{X}$ is a vector of weight coefficients relating $\overline{A}$ and $\overline{B}$, and is expressed as a function of $\overline{B} = \overline{A}\overline{X}$, wherein the solution is expressed as $$\overline{X} = (\overline{A}^T \overline{A})^{-1} \overline{A}^T \overline{B}.$$

4. The non-volatile data storage device of claim 3, wherein the vector $\overline{X}$ and the solution $\overline{X}$ are functions of one or more of program/erase cycles (PEC), retention time (RET), and read disturb (RD), and the solution to the equation $\overline{B} = \overline{A}\overline{X}(PEC, RET, RD)$ is expressed as:

$$\overline{X}(PEC, RET, RD) = (\overline{A}^T \overline{A})^{-1} \overline{A}^T \overline{B}.$$

5. The non-volatile data storage device of claim 3, wherein the recursive update of the weight coefficients comprises recursively finding an optimal $\overline{X}$ in a minimum mean square error (MMSE) estimator to minimize the difference between $\overline{A}\overline{X}$ and $\overline{B}$, formulated as the following equation:

$$\overline{X}(PEC, RET, RD) = \operatorname{argmin}_{\nabla \overline{X}} |\overline{A}\overline{X}(PEC, RET, RD) = -\overline{B}|^2$$

wherein the update equation is given as, $$\overline{X}_{i+1} = \overline{X}_i - \mu \cdot \overline{A}^T \cdot (\overline{A}\overline{X}(PEC, RET, RD) - \overline{B}$$

where $\overline{X}_{i+1}$ are the updated weight coefficients at the (i+1)th instant with i being an integer, and $\mu$ is an adaptation coefficient whose value can be selected heuristically to optimize convergence of the MMSE update equation.

6. The non-volatile data storage device of claim 1, wherein the memory controller is further configured to estimate weight coefficients using a function of program erase cycles (PEC), read disturb (RD), and retention (RET), and apply neighbor assisted and bitline interference corrections on the data with the weight coefficients.

7. The non-volatile data storage device of claim 1, wherein the memory controller is further configured to perform soft decoding using the recursively updated weight coefficients on the fly after a successful soft decoding.

8. A non-volatile data storage device, comprising:
  memory cells arranged in an array having rows and columns, each row associated with a word line and each column associated with a bit line;
  a memory controller coupled to the memory cells for controlling operations of the memory cells;
  wherein the memory controller is configured to:
    perform a read operation in response to a read command from a host;
    perform a first soft decoding of data from the read operation using existing LLR (log likelihood ratio) values stored in the memory controller;
    if the first soft decoding is unsuccessful:
      update existing LLR values using LLR values from neighboring memory cells and existing weight coefficients that account for influence from the neighboring memory cells;
      perform a second soft decoding using the updated LLR values;
      if the second soft decoding is successful:
        determine that the decoding is successful;
        present decoded data to the host;
        perform a recursive update of weight coefficients to reflect updated influence from neighboring memory cells; and
        store the recursively updated weight coefficient in the memory controller for use in further decoding.

9. The non-volatile data storage device of claim 8, wherein an estimated LLR value for a memory cell, at wordline N and bit line K, $ELLR_k^N$, is expressed as a weighted sum of LLR values of memory cells in a vicinity of the memory cell in the following linear equation:

$$ELLR_k^N = [LLR_{k-1}^{N-1}, LLR_k^{N-1}, LLR_{k+1}^{N-1}, LLR_{k-1}^N,\\ LLR_k^N, LLR_{k+1}^N, LLR_{k-1}^{N+1}, LLR_k^{N+1},\\ LLR_{k+1}^{N+1}].$$

$$[W_{k-1}^{N-1}, W_k^{N-1}, W_{k+1}^{N-1}, W_{k-1}^N, W_k^N, W_{k+1}^N,\\ W_{k-1}^{N+1}, W_k^{N+1}, W_{k+1}^{N+1}]^T,$$

wherein:
  $LLR_j^i$ is the LLR value for a neighboring memory cell at (i)th bitline and (j)th wordline; and
  $W_j^i$ is a weight coefficient relating estimated LLR for a memory cell at wordline N and bit line K, $ELLR_k^N$, to an LLR,
  wherein N, K, i, and j are integers, and the superscript T denotes a transpose of a vector or matrix.

10. The non-volatile data storage device of claim 9, wherein initial existing weight coefficients are determined by finding a solution, offline using training data, to the following equation, $$\overline{B} = \overline{A}\overline{X}$$

wherein:
  $\overline{B}$ is a vector of dimension L for estimated LLR values, ELLR, for L memory cells, where L is an integer;
  $\overline{A}$ is a matrix of LLR values of memory cells in the vicinity of each of the L memory cells; and
  $\overline{X}$ is a vector of weight coefficients relating $\overline{A}$ and $\overline{B}$, and is expressed as a function of $\overline{B} = \overline{A}\overline{X}$, wherein the solution is expressed as $\overline{X} = (\overline{A}^T \overline{A})^{-1} \overline{A}^T \overline{B}$.

11. The non-volatile data storage device of claim 10, wherein the vector $\overline{X}$ and the solution $\hat{X}$ are functions of one or more of program/erase cycles (PEC), retention time (RET), and read disturb (RD), and the solution to the equation $\overline{B}=\overline{AX}(PEC, RET, RD)$ is expressed as:

$$\overline{X}(PEC,RET,RD)=(\overline{A}^T\overline{A})^{-1}\overline{A}^T\overline{B}.$$

12. The non-volatile data storage device of claim 10, wherein the recursive update of the weight coefficients comprises recursively finding an optimal $\overline{X}$ in a minimum mean square error (MMSE) estimator to minimize the difference between $\overline{AX}$ and $\overline{B}$, formulated as the following equation:

$$\overline{X}(PEC,RET,RD)=\mathrm{argmin}_{\nabla \overline{X}}|\overline{AX}(PEC,RET,RD)=-\overline{B}|^2$$

wherein the update equation is given as, $$\overline{X}_{i+1}=\overline{X}_i-\mu \cdot \overline{A}^T \cdot (\overline{AX}(PEC,RET,RD)-\overline{B}$$

where $\overline{X}_{i+1}$ are the updated weight coefficients at the (i+1)th instant with i being an integer, and μ is an adaptation coefficient whose value can be selected heuristically to optimize convergence of the MMSE update equation.

13. The non-volatile data storage device of claim 12, wherein the recursive update of the weight coefficients comprises:
 selecting an initial value for $\overline{X}_i$;
 calculating $\overline{X}_{i+1}$ from $\overline{X}_{i+1}=\overline{X}_i-\mu \cdot \overline{A}^T \cdot (\overline{AX}(PEC, RET, RD)-\overline{B}$;
 comparing $\overline{X}_{i+1}$ and $\overline{X}_i$ to determine a difference;
 if the difference is greater than a threshold "th," repeat above processes;
 if the difference is less than the threshold "th," determining that $\overline{X}_i$ is the updated weight coefficients; and
 storing the updated weight coefficients in the memory controller.

14. The non-volatile data storage device of claim 8, wherein the memory controller is further configured to estimate weight coefficients using a function of program erase cycles (PEC), read disturb (RD), and retention (RET), and apply neighbor assisted and bitline interference corrections on the data with the weight coefficients.

15. The non-volatile data storage device of claim 8, wherein the memory controller is further configured to perform soft decoding using the recursively updated weight coefficients on the fly after a successful soft decoding.

16. A method of operating a storage system, the storage system including memory cells arranged in an array and a memory controller coupled to the memory cells for controlling operations of the memory cells, the method comprising:
 performing a read operation in response to a read command from a host;
 performing a first soft decoding of data from the read operation using existing LLR (log likelihood ratio) values stored in the memory controller;
 updating existing LLR values using LLR values from neighboring memory cells and existing weight coefficients that account for influence from the neighboring memory cells;
 performing a second soft decoding using the updated LLR values;
 if the second soft decoding is successful:
  determining that the decoding is successful;
  presenting decoded data to the host;
  performing a recursive update of weight coefficients to reflect updated influence from neighboring memory cells; and
  storing the updated weight coefficient in the memory controller for use in further decoding.

17. The method of claim 16, wherein an estimated LLR value for a memory cell, at wordline N and bit line K, $ELLR_k^N$, is expressed as a weighted sum of LLR values of memory cells in a vicinity of the memory cell in the following linear equation:

$$ELLR_k^N=[LLR_{k-1}^{N-1},LLR_k^{N-1},LLR_{k+1}^{N-1},LLR_{k-1}^N,$$
$$LLR_k^N,LLR_{k+1}^N,LLR_{k-1}^{N+1},LLR_k^{N+1},$$
$$LLR_{k+1}^{N+1}].$$

$$[W_{k-1}^{N-1},W_k^{N-1},W_{k+1}^{N-1},W_{k-1}^N,W_k^N,W_{k+1}^N,$$
$$W_{k-1}^{N+1},W_k^{N+1},W_{k+1}^{N+1}]^T,$$

wherein:
 $LLR_j^i$ is the LLR value for a neighboring memory cell at (i)th bitline and (j)th wordline; and
 $W_j^i$ is a weight coefficient relating estimated LLR for a memory cell at wordline N and bit line K, $ELLR_k^N$, to an LLR,
 wherein N, K, i, and j are integers, and the superscript T denotes a transpose of a vector or matrix.

18. The method of claim 17, wherein initial existing weight coefficients are determined by finding a solution, offline using training data, to the following equation, $$\overline{B}=\overline{AX}$$

wherein:
 $\overline{B}$ is a vector of dimension L for estimated LLR values, ELLR, for L memory cells, where L is an integer;
 $\overline{A}$ is a matrix of LLR values of memory cells in the vicinity of each of the L memory cells; and
 $\overline{X}$ is a vector of weight coefficients relating $\overline{A}$ and $\overline{B}$, and is expressed as a function of $\overline{B}=\overline{AX}$, wherein the solution is expressed as $\overline{X}=(\overline{A}^T\overline{A})^{-1}\overline{A}^T\overline{B}$.

19. The method of claim 18, wherein the recursive update of the weight coefficients comprises recursively finding an optimal $\overline{X}$ in a minimum mean square error (MMSE) estimator to minimize the difference between $\overline{AX}$ and $\overline{B}$, formulated as the following equation:

$$\overline{X}(PEC,RET,RD)=\mathrm{argmin}_{\nabla \overline{X}}|\overline{AX}(PEC,RET,RD)=-\overline{B}|^2$$

wherein the update equation is given as, $$\overline{X}_{i+1}=\overline{X}_i-\mu \cdot \overline{A}^T \cdot (\overline{AX}(PEC,RET,RD)-\overline{B}$$

where $\overline{X}_{i+1}$ are the updated weight coefficients at the (i+1)th instant with i being an integer, and μ is an adaptation coefficient whose value can be selected heuristically to optimize convergence of the MMSE update equation.

20. The method of claim 16, further comprising performing soft decoding using the recursively updated weight coefficients on the fly after a successful soft decoding.

* * * * *